United States Patent
Kageyama

(10) Patent No.: US 12,500,129 B2
(45) Date of Patent: Dec. 16, 2025

(54) SEMICONDUCTOR DEVICE AND METHOD OF MANUFACTURING SEMICONDUCTOR DEVICE

(71) Applicant: ROHM CO., LTD., Kyoto (JP)

(72) Inventor: Satoshi Kageyama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 633 days.

(21) Appl. No.: 17/820,306

(22) Filed: Aug. 17, 2022

(65) Prior Publication Data

US 2023/0092639 A1    Mar. 23, 2023

(30) Foreign Application Priority Data

Sep. 22, 2021 (JP) ................. 2021-153877

(51) Int. Cl.
   *H01L 23/13*    (2006.01)
   *H01L 23/00*    (2006.01)
   *H01L 23/48*    (2006.01)

(52) U.S. Cl.
   CPC .............. *H01L 23/13* (2013.01); *H01L 23/48* (2013.01); *H01L 24/03* (2013.01); *H01L 24/05* (2013.01); *H01L 24/27* (2013.01); *H01L 24/32* (2013.01); *H01L 2224/0346* (2013.01); *H01L 2224/04026* (2013.01); *H01L 2224/2746* (2013.01); *H01L 2224/32148* (2013.01)

(58) Field of Classification Search
   CPC .......... H01L 23/13; H01L 23/48; H01L 24/03
   See application file for complete search history.

(56) References Cited

U.S. PATENT DOCUMENTS

| 10,734,368 B2 * | 8/2020 | Kiel ................ H01L 23/5385 |
| 2010/0264552 A1 * | 10/2010 | Nakasato ............ H01L 24/81 |
| | | 174/266 |

FOREIGN PATENT DOCUMENTS

| JP | 2013239740 A | 11/2013 |
| JP | 2019161149 A | 9/2019 |
| JP | 2021093454 A | 6/2021 |

OTHER PUBLICATIONS

Office Action issued in Japan Patent Application No. 2021-153877, mailed on Aug. 26, 2025, with with machine translation.

* cited by examiner

*Primary Examiner* — Dale E Page
*Assistant Examiner* — Wilner Jean Baptiste
(74) *Attorney, Agent, or Firm* — HSML P. C.

(57) ABSTRACT

A semiconductor device includes: a conductive portion; and a semiconductor element mounted on the conductive portion, wherein the conductive portion is made of a plating layer, wherein the conductive portion includes a mounting portion having a mounting surface on which the semiconductor element is mounted, and a terminal portion extending to an opposite side of the semiconductor element with respect to the mounting portion, wherein the mounting portion extends in a first direction along the mounting surface more than the terminal portion, and wherein the mounting portion and the terminal portion are integrally formed.

11 Claims, 27 Drawing Sheets

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2021-153877, filed on Sep. 22, 2021, the entire contents of which are incorporated herein by reference.

TECHNICAL FIELD

The present disclosure relates to a semiconductor device and a method of manufacturing the semiconductor device.

BACKGROUND

In the related art, semiconductor devices have been miniaturized along with miniaturization of electronic apparatuses. In the related art, an example of a semiconductor device is disclosed. This semiconductor device includes a rectangular die pad, a plurality of leads arranged around the die pad, a semiconductor chip mounted on the die pad, and a sealing resin that seals the semiconductor chip. The plurality of leads are wirings that electrically connect the semiconductor chip and the outside of the semiconductor device. In a method of manufacturing the semiconductor device, the semiconductor chip is mounted on the die pad of a lead frame, and all semiconductor chips on the lead frame are collectively sealed with a resin. Then, the resin and the lead frame are cut by a dicing saw along a preset dicing line. As a result, individual semiconductor devices may be obtained.

However, when the lead is made of a plurality of plating layers, peeling may occur at an interface between the plating layers.

SUMMARY

According to an embodiment of the present disclosure, a semiconductor device includes: a conductive portion; and a semiconductor element mounted on the conductive portion, wherein the conductive portion includes a mounting portion having a mounting surface on which the semiconductor element is mounted, and a terminal portion extending to opposite side of the semiconductor element with respect to the mounting portion, wherein the mounting portion extends in a first direction along the mounting surface more than the terminal portion, and wherein the mounting portion and the terminal portion are integrally formed.

According to another embodiment of the present disclosure, a method of manufacturing a semiconductor device which includes a conductive portion, and a semiconductor element mounted on the conductive portion, wherein the conductive portion includes a mounting portion having a mounting surface on which the semiconductor element is mounted, and a terminal portion extending to an opposite side of the semiconductor element with respect to the mounting portion, the method including integrally forming the mounting portion and the terminal portion by a plating layer.

DETAILED DESCRIPTION

Figure 1:
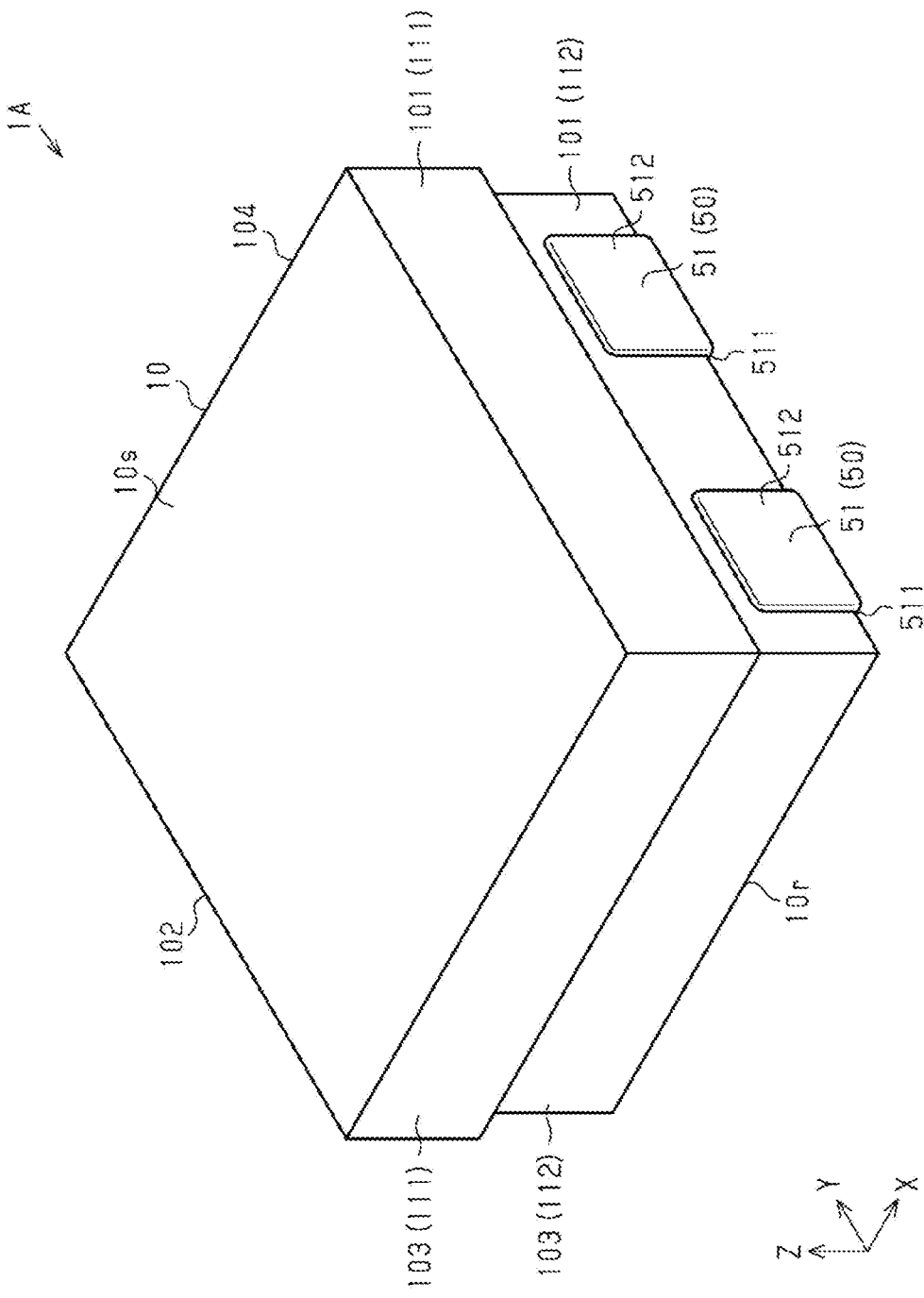
FIG. 1 is a perspective view of a semiconductor device according to an embodiment of the present disclosure, as viewed from an upper surface side.

Embodiments and modifications will be now described with reference to the drawings. The following embodiments and modifications are examples of configurations and methods for embodying technical ideas, and materials, shapes, structures, arrangements, dimensions and the like of the respective components are not limited to the following. Various changes may be added to the following embodiments and modifications. The following embodiments and modifications may be implemented in combination unless technically contradictory.

Hereinafter, embodiments of a semiconductor device of the present disclosure will be described with reference to the accompanying drawings. For the sake of simplicity and clarity, the components shown in the drawings are not necessarily drawn to a certain scale. In addition, hatching lines may be omitted in the cross-sectional view for the sake of ease of understanding. The accompanying drawings merely illustrate embodiments of the present disclosure and should not be considered as limiting the present disclosure.

The following detailed description includes devices, systems, and methods that embody the exemplary embodiments of the present disclosure. This detailed description is intended for illustration purposes only and is not intended to limit the embodiments of the present disclosure or application and use of such embodiments.

An Embodiment

Figure 2:
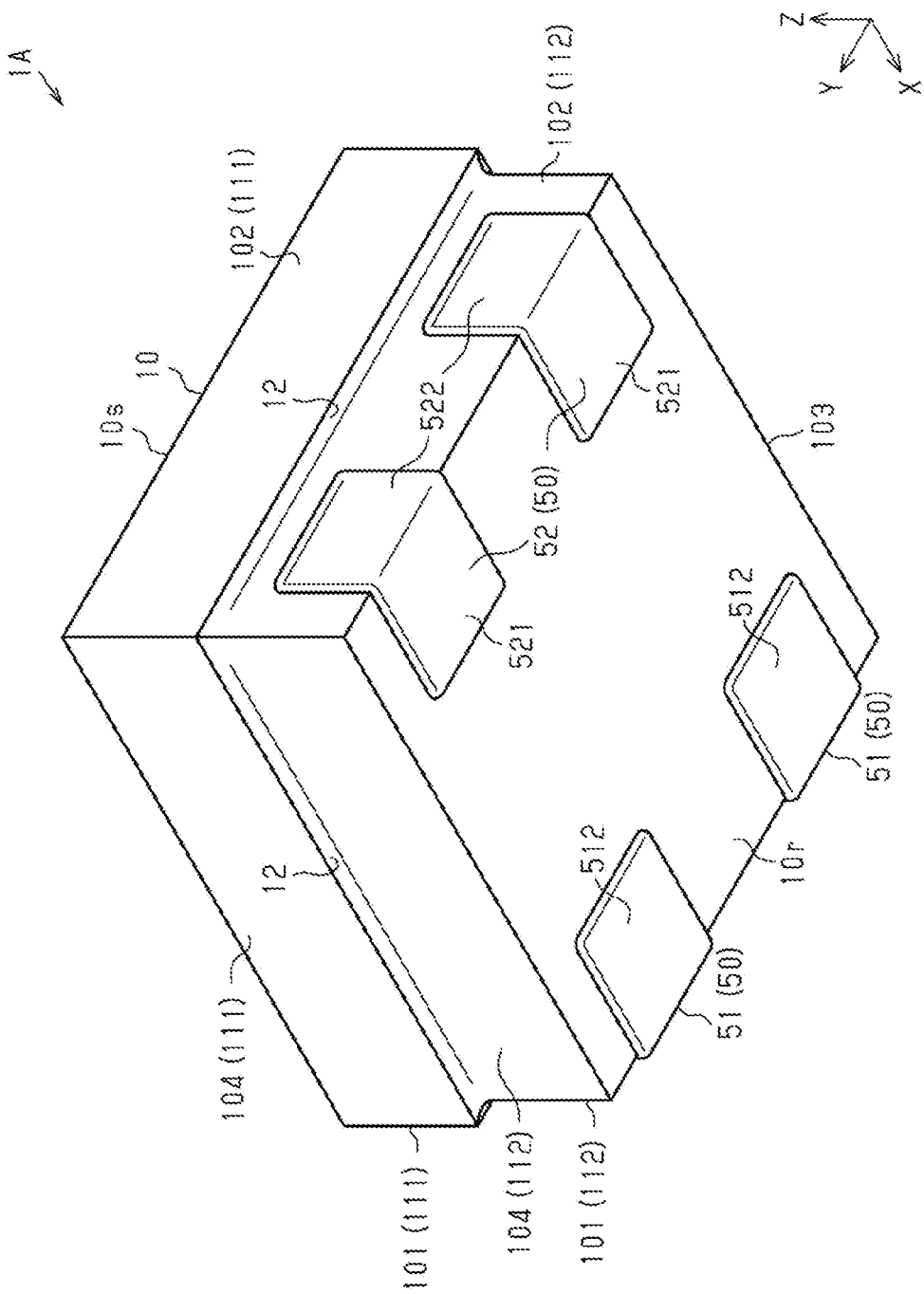
FIG. 2 is a perspective view of the semiconductor device of FIG. 1, as viewed from a lower surface side.
Figure 3:
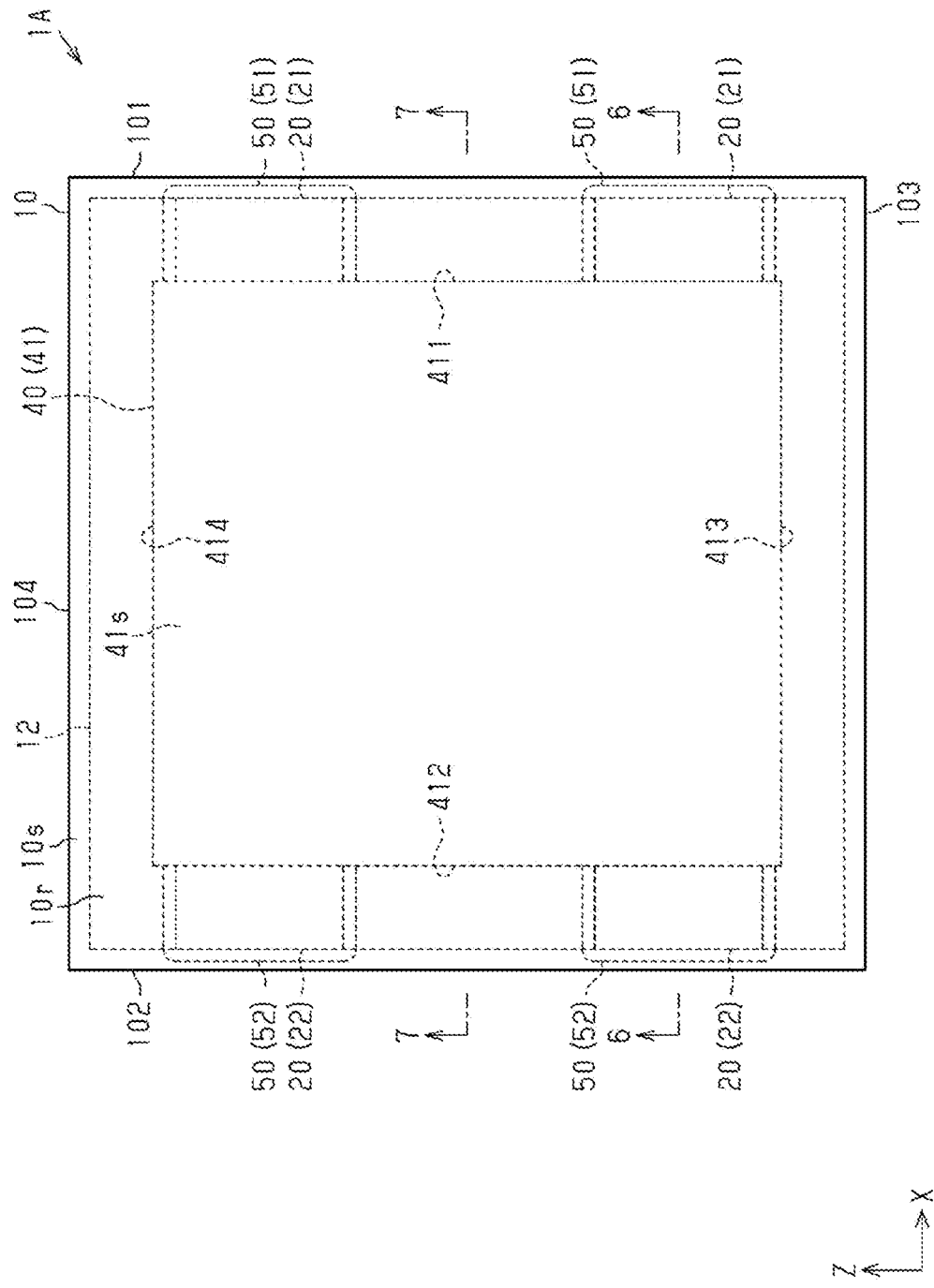
FIG. 3 is a schematic top view of the semiconductor device of FIG. 1.
Figure 4:
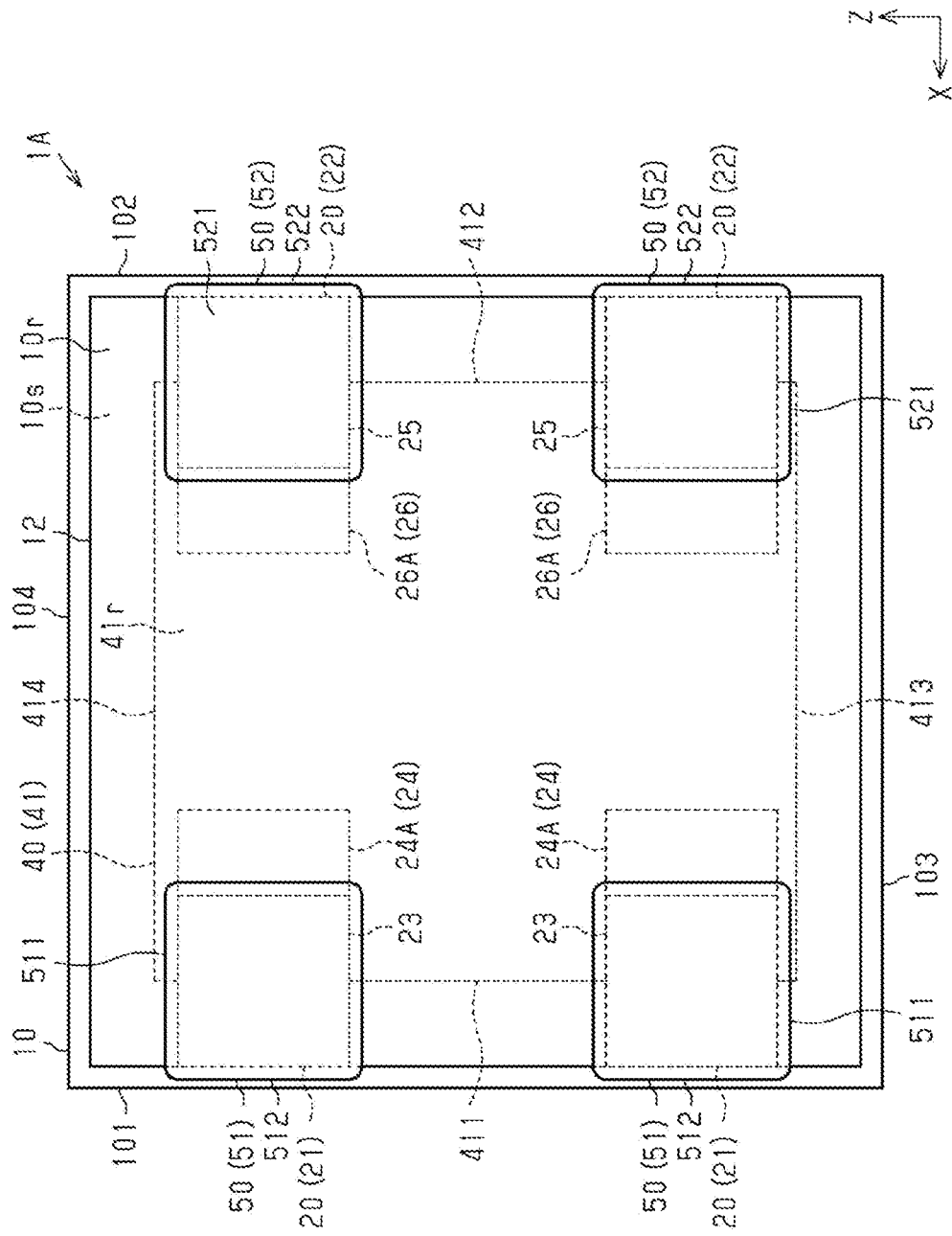
FIG. 4 is a schematic bottom view of the semiconductor device of FIG. 1.
Figure 5:
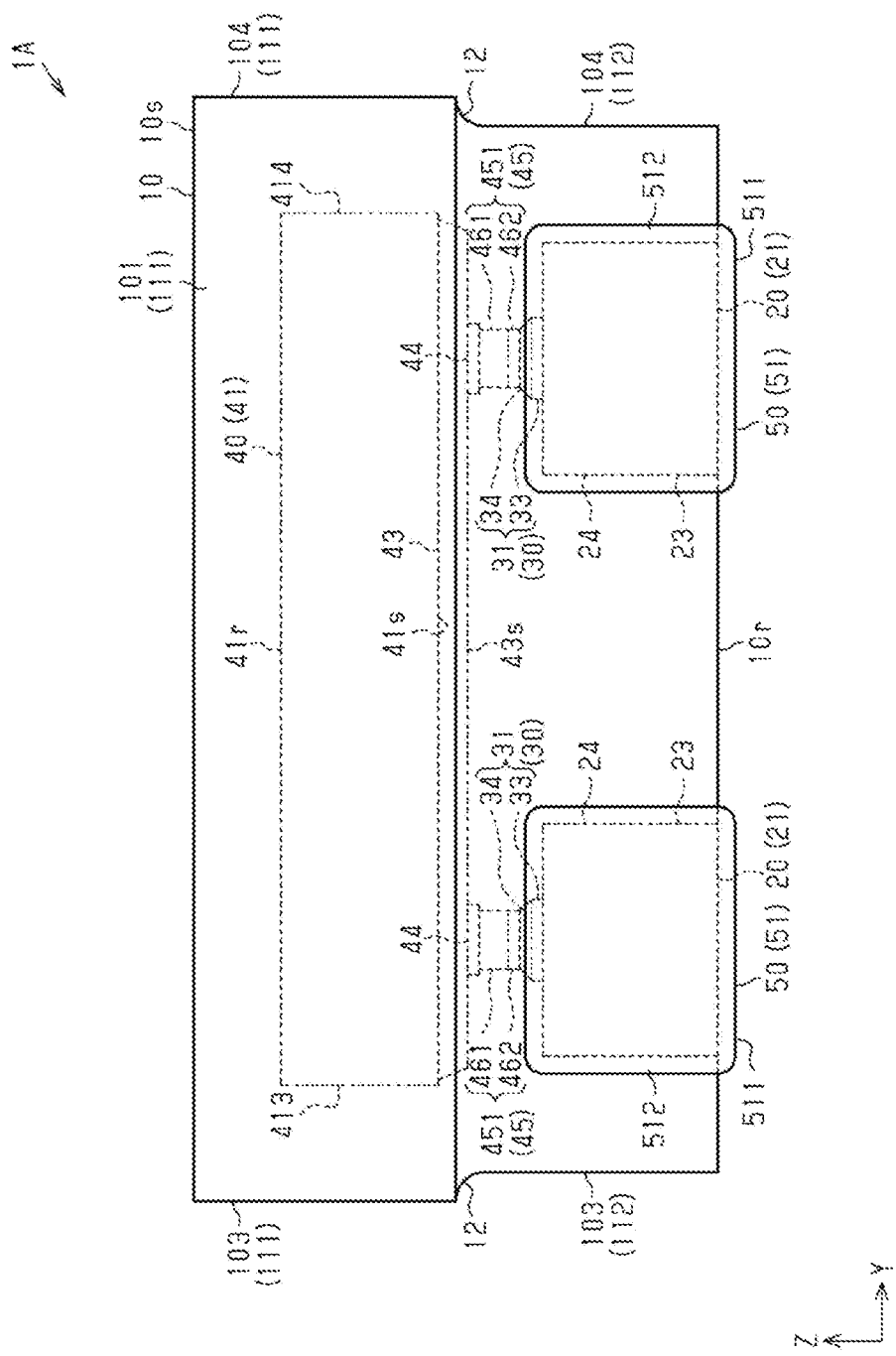
FIG. 5 is a schematic side view of the semiconductor device of FIG. 1.
Figure 6:
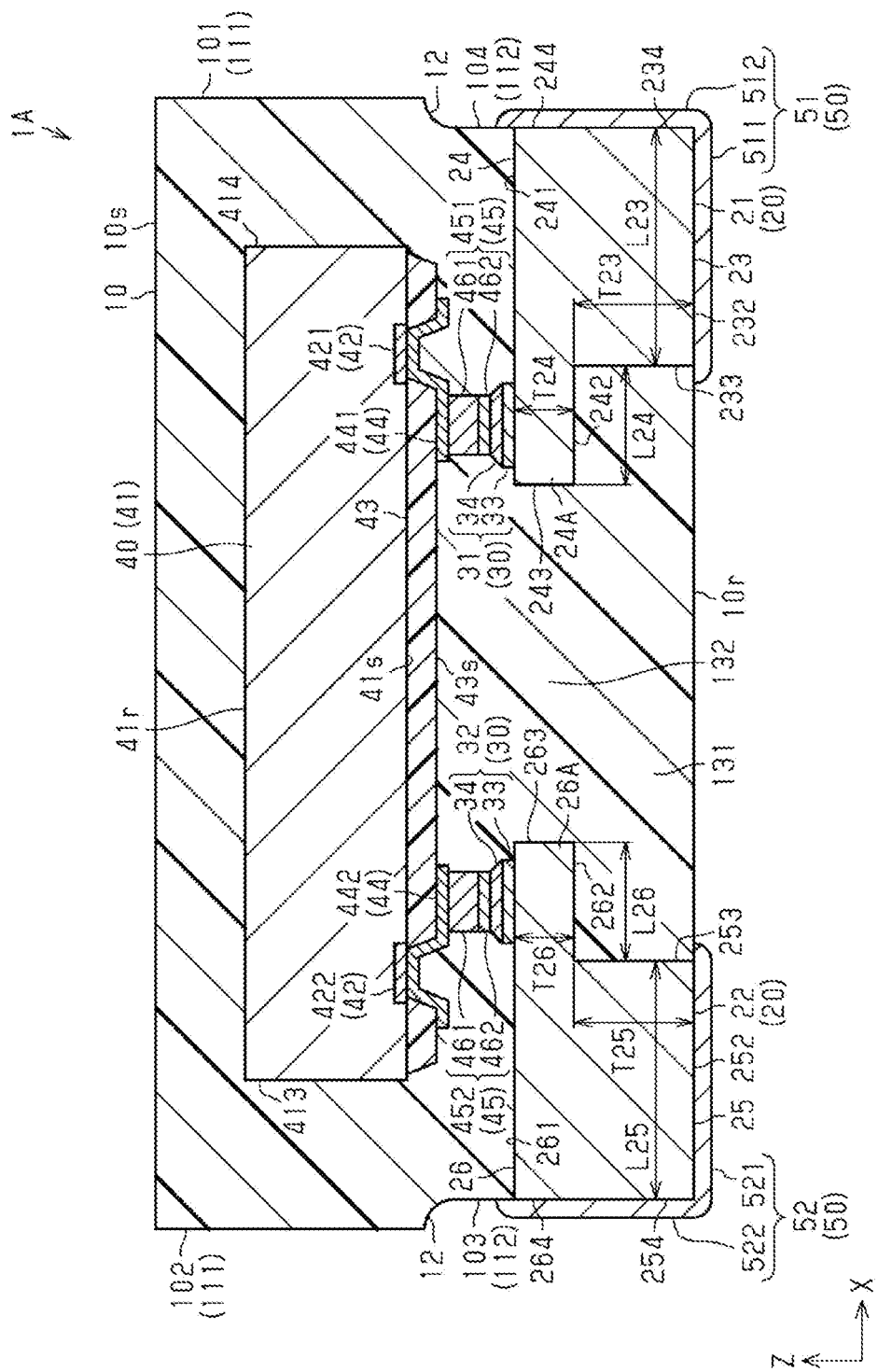
FIG. 6 is a cross-sectional view taken along line 6-6 of FIG. 3.
Figure 7:
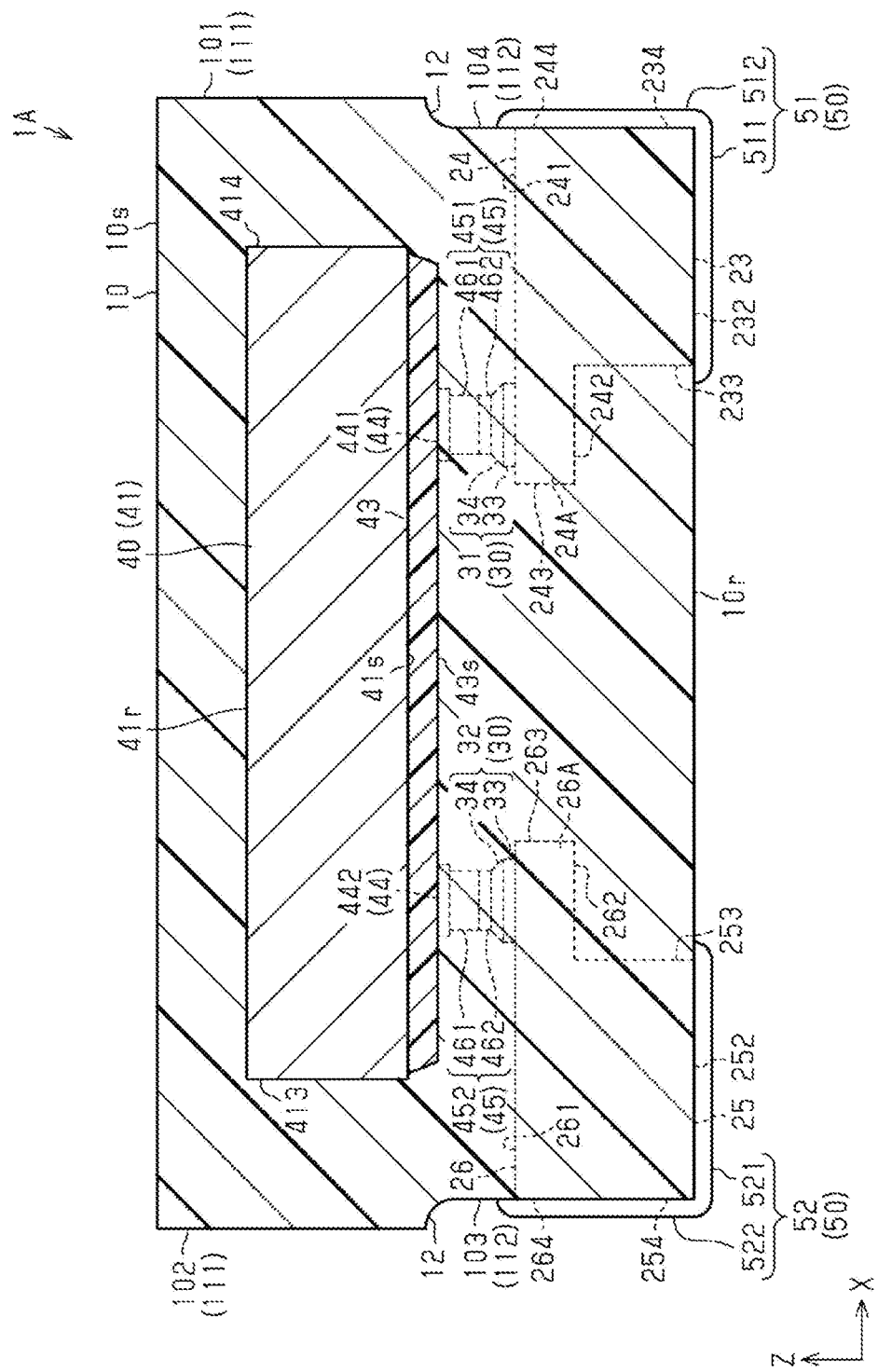
FIG. 7 is a cross-sectional view taken along line 7-7 of FIG. 3.

Hereinafter, a semiconductor device 1A in an embodiment of the present disclosure will be described. FIGS. 1 and 2 are perspective views showing an appearance of the semiconductor device 1A. FIG. 1 is the perspective view of the semiconductor device 1A, as viewed from an upper surface side, and FIG. 2 is a perspective view of the semiconductor device 1A, as viewed from a lower surface side. FIG. 3 is a schematic top view of the semiconductor device 1A. FIG. 4 is a schematic bottom view of the semiconductor device 1A. FIG. 5 is a schematic side view of the semiconductor device 1A. FIG. 6 is a cross-sectional view taken along line 6-6 of FIG. 3. FIG. 7 is a cross-sectional view taken along line 7-7 of FIG. 3. FIGS. 8 to 22 are cross-sectional views showing an example of a manufacturing process of the semiconductor device 1A.

The semiconductor device 1A shown in these figures is a device that is surface-mounted on circuit boards of various electronic apparatuses. As shown in FIGS. 1 and 2, the semiconductor device 1A has a rectangular plate shape. Here, for the sake of convenience of explanation, a thickness direction of the semiconductor device 1A is defined as a Z direction. Then, a first direction and a second direction orthogonal to each other among directions orthogonal to the Z direction are defined as an X direction and a Y direction, respectively.

[Schematic Configuration of Semiconductor Device]

As shown in FIGS. 1 and 2, the semiconductor device 1A includes a sealing resin 10 and a plurality of external conductive films 50. As shown in FIGS. 3 to 7, the semiconductor device 1A includes a semiconductor element 40, a conductive portion 20, and a bonding portion 30. The sealing resin 10 seals the semiconductor element 40, the conductive portion 20, and the bonding portion 30. The semiconductor element 40 is mounted on the conductive portion 20. More specifically, the conductive portion 20 is electrically connected to the semiconductor element 40 by the bonding portion 30.

[Sealing Resin]

The sealing resin 10 seals the conductive portion 20, the bonding portion 30, and the semiconductor element 40. The sealing resin 10 has a resin upper surface 10s and a resin lower surface 10r. The resin upper surface 10s and the resin lower surface 10r face opposite sides from each other in the Z direction. The resin upper surface 10s is flat. The resin lower surface 10r is flat. Further, the sealing resin 10 has a plurality of resin side surfaces 101, 102, 103, and 104. The first resin side surface 101 and the second resin side surface 102 face opposite sides from each other in the X direction. The third resin side surface 103 and the fourth resin side surface 104 face opposite sides from each other in the Y direction.

Each of the resin side surfaces 101 to 104 of the sealing resin 10 has a first side surface 111 and a second side surface 112. The first side surface 111 is arranged closer to the resin upper surface 10s than the resin lower surface 10r in the Z direction. The second side surface 112 is arranged closer to the resin lower surface 10r than the resin upper surface 10s in the Z direction. The second side surface 112 of each of the resin side surfaces 101 to 104 is located inside the sealing resin 10 with respect to the first side surface 111 of each of the resin side surfaces 101 to 104 when viewed in the Z direction. That is, the sealing resin 10 is configured such that the side of the resin upper surface 10s is larger than the side of the resin lower surface 10r in the Z direction.

In the present embodiment, the first side surface 111 of each of the resin side surfaces 101 to 104 is orthogonal to the resin upper surface 10s. Further, in the present embodiment, the second side surface 112 of each of the resin side surfaces 101 to 104 is orthogonal to the resin lower surface 10r. The sealing resin 10 of the present embodiment includes a step 12 recessed toward an inside of the sealing resin 10 when viewed in the Z direction, due to positions on the first side surface 111 and the second side surface 112. As shown in FIGS. 1 and 2, the step 12 is provided over the entire circumferential direction of the sealing resin 10.

The sealing resin 10 is made of, for example, a resin having electrical insulation. As this resin, for example, a synthetic resin containing an epoxy resin as a main component may be used. As the sealing resin 10, for example, a synthetic resin containing a filler may be used. The filler is made of, for example, $SiO_2$. Further, the sealing resin 10 is colored black, for example. The material and shape of the sealing resin 10 are not limited.

[Conductive Portion]

The conductive portion 20 includes a first conductive portion 21 and a second conductive portion 22. The first conductive portion 21 is provided on the side of the first resin side surface 101 of the sealing resin 10, and the second conductive portion 22 is provided on the side of the second resin side surface 102 of the sealing resin 10. The semiconductor device 1A of the present embodiment includes two first conductive portions 21 and two second conductive portions 22. In the present embodiment, the third resin side surface 103 and the fourth resin side surface 104 are surfaces on which no conductive portion is provided.

The first conductive portion 21 includes a first terminal portion 23 and a first mounting portion 24. The semiconductor element 40 is mounted on the first mounting portion 24. The first terminal portion 23 extends to the opposite side of the semiconductor element 40 with respect to the first mounting portion 24. That is, the first conductive portion 21 includes the first mounting portion 24 on which the semiconductor element 40 is mounted, and the first terminal portion 23 extending to the opposite side of the semiconductor element 40 with respect to the first mounting portion 24.

As shown in FIGS. 3 to 7, the first mounting portion 24 extends from a position where it overlaps with the semiconductor element 40 to the first resin side surface 101 of the sealing resin 10 in the Z direction. The first mounting portion 24 is exposed from the first resin side surface 101. The first terminal portion 23 is arranged on the side of the first resin side surface 101 of the sealing resin 10 in the first mounting portion 24. The first terminal portion 23 is exposed from the sealing resin 10 and is exposed from the first resin side surface 101 of the sealing resin 10. Therefore, the first mounting portion 24 extends to an inner side of the semiconductor device 1A with respect to the first terminal portion 23. That is, the first mounting portion 24 includes a protruding portion 24A that protrudes from the first terminal portion 23 toward the inner side of the semiconductor device 1A.

The first mounting portion 24 and the first terminal portion 23 are integrally formed without an interface formed therebetween. The first mounting portion 24 and the first terminal portion 23 are made of the same material. The first mounting portion 24 and the first terminal portion 23 are made of a plating layer. The constituent materials of the first mounting portion 24 and the first terminal portion 23 include, for example, Cu (copper) and a Cu alloy.

The first mounting portion 24 has an upper surface 241, a lower surface 242, and side surfaces 243 and 244. The upper surface 241 and the lower surface 242 face opposite sides from each other in the Z direction. The upper surface 241 faces the same side as the resin upper surface 10s. The upper surface 241 is a mounting surface on which the semiconductor element 40 is mounted. The lower surface 242 is a surface of the protruding portion 24A of the first mounting portion 24 that faces an opposite side of the semiconductor element 40. The side surfaces 243 and 244 face a direction intersecting the upper surface 241 and the lower surface 242. The side surface 243 is covered with the sealing resin 10. The side surface 244 is an exposed surface exposed from the first resin side surface 101 (the second side surface 112) of the sealing resin 10.

The first terminal portion 23 has a lower surface 232 and side surfaces 233 and 234. The lower surface 232 is exposed from the resin lower surface 10r of the sealing resin 10. The side surface 233 is covered with the sealing resin 10. The side surface 234 is exposed from the first resin side surface 101 of the sealing resin 10.

A thickness T24 of the first mounting portion 24 in the Z direction is 20 μm or more and 100 μm or less. In the present embodiment, the thickness T24 of the first mounting portion 24 is 50 μm. A thickness T23 of the first terminal portion 23 in the Z direction is 50 μm or more and 200 μm or less. In the present embodiment, the thickness T23 of the first terminal portion 23 is 100 μm. The thickness of the first terminal portion 23 may be equal to or more than twice the thickness of the first mounting portion 24. In the present embodiment, the thickness T23 of the first terminal portion 23 is twice the thickness of the first mounting portion 24. In the X direction, a length L23 of the first terminal portion 23 is 100 μm or more and 200 μm or less. In the present embodiment, the length L23 of the first terminal portion 23 is 200 μm. The length of the first mounting portion 24 is defined as a length L24 of the protruding portion 24A protruding from the first terminal portion 23. The length L24 of the first mounting portion 24 is 100 μm or more and 150 μm or less. In the present embodiment, the length L24 of the first mounting portion 24 is 100 μm.

The second conductive portion 22 includes a second terminal portion 25 and a second mounting portion 26. The semiconductor element 40 is mounted on the second mounting portion 26. The second terminal portion 25 extends to the opposite side of the semiconductor element 40 with respect to the second mounting portion 26. That is, the second conductive portion 22 includes the second mounting portion 26 on which the semiconductor element 40 is mounted, and the second terminal portion 25 extending to the opposite side of the semiconductor element 40 with respect to the second mounting portion 26.

As shown in FIGS. 3 to 7, the second mounting portion 26 extends from a position where it overlaps with the semiconductor element 40 to the second resin side surface 102 of the sealing resin 10 in the Z direction. The second mounting portion 26 is exposed from the second resin side surface 102. The second terminal portion 25 is arranged on the side of the second resin side surface 102 of the sealing resin 10 in the second mounting portion 26. The second terminal portion 25 is exposed from the resin lower surface 10r of the sealing resin 10 and is exposed from the second resin side surface 102 of the sealing resin 10. Therefore, the second mounting portion 26 extends to an inner side of the semiconductor device 1A with respect to the second terminal portion 25. That is, the second mounting portion 26 includes a protruding portion 26A that protrudes from the second terminal portion 25 toward the inner side of the semiconductor device 1A.

The second mounting portion 26 and the second terminal portion 25 are integrally formed without an interface formed therebetween. The second mounting portion 26 and the second terminal portion 25 are made of the same material. The second mounting portion 26 and the second terminal portion 25 are made of a plating layer. The constituent materials of the second mounting portion 26 and the second terminal portion 25 include, for example, Cu and a Cu alloy.

The second mounting portion 26 has an upper surface 261, a lower surface 262, and side surfaces 263 and 264. The upper surface 261 and the lower surface 262 face opposite sides from each other in the Z direction. The upper surface 261 faces the same side as the resin upper surface 10s. The upper surface 261 is a mounting surface on which the semiconductor element 40 is mounted. The lower surface 262 is a surface of the protruding portion 26A of the second mounting portion 26 that faces an opposite side of the semiconductor element 40. The side surfaces 263 and 264 face a direction intersecting the upper surface 261 and the lower surface 262. The side surface 263 is covered with the sealing resin 10. The side surface 264 is an exposed surface exposed from the second resin side surface 102 (the second side surface 112) of the sealing resin 10.

The second terminal portion 25 has a lower surface 252 and side surfaces 253 and 254. The lower surface 252 is exposed from the resin lower surface 10r of the sealing resin 10. The side surface 253 is covered with the sealing resin 10. The side surface 254 is exposed from the second resin side surface 102 of the sealing resin 10.

A thickness T26 of the second mounting portion 26 in the Z direction is 20 μm or more and 100 μm or less. In the present embodiment, the thickness T26 of the second mounting portion 26 is 50 μm. A thickness T25 of the second terminal portion 25 in the Z direction is 50 μm or more and 200 μm or less. In the present embodiment, the thickness T25 of the second terminal portion 25 is 100 μm. The thickness of the second terminal portion 25 may be equal to or more than twice the thickness of the second mounting portion 26. In the present embodiment, the thickness T25 of the second terminal portion 25 is twice the thickness of the second mounting portion 26. In the X direction, a length L25 of the second terminal portion 25 is 100 μm or more and 200 μm or less. In the present embodiment, the length L25 of the second terminal portion 25 is 200 μm. In the X direction, the length L25 of the second terminal portion 25 is 100 μm or more and 200 μm or less. In the present embodiment, the length L25 of the second terminal portion 25 is 200 μm. The length of the second mounting portion 26 is defined as a length L26 of the protruding portion 26A protruding from the second terminal portion 25. The length L26 of the second mounting portion 26 is 100 µm or more and 150 µm or less. In the present embodiment, the length L26 of the second mounting portion 26 is 100 µm.

[Bonding Portion]

As shown in FIG. 6, the bonding portion 30 is provided on the conductive portion 20. The bonding portion 30 includes a first bonding portion 31 provided on the first conductive portion 21 and a second bonding portion 32 provided on the second conductive portion 22. The first bonding portion 31 and the second bonding portion 32 bond the semiconductor element 40 to the first conductive portion 21 and the second conductive portion 22, respectively.

The first bonding portion 31 and the second bonding portion 32 include a plating layer 33 and a solder layer 34. The plating layer 33 is provided on the upper surfaces 241 and 261 of the mounting portions 24 and 26. The plating layer 33 is made of a conductive metal material. The plating layer 33 is made of, for example, Ni (nickel). The solder layer 34 is provided between the plating layer 33 and an element electrode 45 of the semiconductor element 40. The solder layer 34 connects the plating layer 33 and the element electrode 45. The solder layer 34 is made of an alloy containing Sn (tin) and an alloy containing Sn. This alloy is, for example, a Sn—Ag (silver)-based alloy, a Sn—Sb (antimony)-based alloy, or the like.

[Semiconductor Element]

As shown in FIGS. 3 to 7, the semiconductor element 40 has a rectangular shape when viewed from the Z direction. As shown in FIG. 6, the semiconductor element 40 includes an element substrate 41, an electrode pad 42, an insulating film 43, a rewiring layer 44, and an element electrode 45.

As shown in FIGS. 3 to 7, the element substrate 41 has a substrate main surface 41s, a substrate back surface 41r, and a plurality of substrate side surfaces 411, 412, 413, and 414. The substrate main surface 41s and the substrate back surface 41r face opposite sides from each other in the Z direction. As shown in FIGS. 3 and 4, the first substrate side surface 411 and the second substrate side surface 412 face opposite sides from each other in the X direction. The third substrate side surface 413 and the fourth substrate side surface 414 face opposite sides from each other in the Y direction. The substrate main surface 41s faces the upper surfaces 241 and 261 of the mounting portions 24 and 26. The substrate back surface 41r faces the same direction as the resin upper surface 10s.

The semiconductor element 40 is an integrated circuit (IC) such as an LSI (Large Scale Integration). Further, the semiconductor element 40 may be a voltage-controlled element such as an LDO (Low Drop Out), an amplification element such as an operational amplifier, or a discrete semiconductor element such as a diode or various sensors. For example, in the case of an LSI, the substrate main surface 41s is a surface on which a constituent member for the function of the semiconductor element 40 is formed. The semiconductor element 40 is not limited to an element in which a plurality of constituent members are formed, but may be an element in which a single constituent member is formed, such as a chip capacitor or a chip inductor, or an element in which a constituent member is formed on a base material other than a semiconductor. In the present embodiment, the semiconductor element 40 is an LSI.

The electrode pad 42 includes a first electrode pad 421 and a second electrode pad 422. The first electrode pad 421 and the second electrode pad 422 are provided on the substrate main surface 41s of the element substrate 41. The first electrode pad 421 is arranged near the first substrate side surface 411. The second electrode pad 422 is arranged near the second substrate side surface 412.

The insulating film 43 is formed to cover the substrate main surface 41s. The insulating film 43 is formed to cover peripheral portions of the first electrode pad 421 and the second electrode pad 422. A portion of the first electrode pad 421 and a portion of the second electrode pad 422 are exposed from the insulating film 43. The insulating film 43 is made of, for example, SiN. The surface 43s of the insulating film 43 constitutes the element main surface of the semiconductor element 40. The substrate back surface 41r of the element substrate 41 constitutes the element back surface of the semiconductor element 40. The substrate side surfaces 411 to 414 of the element substrate 41 constitute the element side surfaces of the semiconductor element 40.

The rewiring layer 44 includes a first rewiring layer 441 and a second rewiring layer 442. The first rewiring layer 441 is connected to the first electrode pad 421. The first rewiring layer 441 extends from the first electrode pad 421 to the insulating film 43 and is in contact with the surface 43s of the insulating film 43. The second rewiring layer 442 is connected to the second electrode pad 422. The second rewiring layer 442 extends from the second electrode pad 422 to the insulating film 43 and is in contact with the surface 43s of the insulating film 43. The first rewiring layer 441 and the second rewiring layer 442 are made of, for example, Cu, a Cu alloy, or the like.

The element electrode 45 includes a first element electrode 451 and a second element electrode 452. The first element electrode 451 is arranged at a position where it does not overlap with the first electrode pad 421 when viewed in the Z direction. That is, the first electrode pad 421 and the first element electrode 451 are displaced in a direction intersecting the Z direction. The first element electrode 451 is connected to the first rewiring layer 441. The second element electrode 452 is arranged at a position where it does not overlap with the second electrode pad 422 when viewed in the Z direction. That is, the second electrode pad 422 and the second element electrode 452 are displaced in the direction intersecting the Z direction. The second element electrode 452 is connected to the second rewiring layer 442.

The first element electrode 451 and the second element electrode 452 include a conductive layer 461 and a barrier layer 462. The conductive layer 461 is made of, for example, a Cu or Cu alloy. The conductive layer 461 may include a seed layer. The seed layer is made of, for example, Ti (titanium)/Cu. The barrier layer 462 is made of Ni, an alloy containing Ni, or a plurality of metal layers containing Ni. As the barrier layer 462, for example, Ni, Pd (palladium), Au (gold), an alloy containing two or more of these metals, and the like may be used.

[External Conductive Film]

The external conductive film 50 includes a first external conductive film 51 and a second external conductive film 52. The first external conductive film 51 is formed to cover the surface of the first conductive portion 21 exposed from the sealing resin 10.

The first external conductive film 51 includes a first conductive film 511 and a second conductive film 512. The first conductive film 511 covers the lower surface 232 of the first terminal portion 23 exposed from the resin lower surface 10r of the sealing resin 10. The second conductive film 512 covers the side surface 234 of the first terminal portion 23 and the side surface 244 of the first mounting portion 24, which are exposed from the first resin side surface 101 of the sealing resin 10. The first external conductive film 51 including the first conductive film 511 and the second conductive film 512 serves as an external connection terminal of the semiconductor device 1A. The first external conductive film 51 is made of, for example, a plurality of metal layers laminated with one another. Examples of the metal layer include a Ni layer, a Pd layer, and an Au layer. The material of the first external conductive film 51 is not limited, but may be configured by laminating, for example, a Ni layer and an Au layer, or may be Sn.

The second external conductive film 52 is formed to cover the surface of the second conductive portion 22 exposed from the sealing resin 10. The second external conductive film 52 includes a first conductive film 521 and a second conductive film 522. The first conductive film 521 covers the lower surface 252 of the second terminal portion 25 exposed from the resin lower surface 10r of the sealing resin 10. The second conductive film 522 covers the side surface 254 of the second terminal portion 25 and the side surface 264 of the second mounting portion 26, which are exposed from the second resin side surface 102 of the sealing resin 10. The second external conductive film 52 including the first conductive film 521 and the second conductive film 522 serves as an external connection terminal of the semiconductor device 1A. The second external conductive film 52 is made of the same material as, for example, the first external conductive film 51. The second external conductive film 52 includes, for example, a plurality of metal layers laminated with one another. Examples of the metal layer are a Ni layer, a Pd layer, and an Au layer. The material of the second external conductive film 52 is not limited, but may be configured by laminating, for example, a Ni layer and an Au layer, or may be Sn. Further, the second external conductive film 52 may be made of material different from that of the first external conductive film 51.

As shown in FIGS. 6 and 7, the sealing resin 10 seals the conductive portion 20, the bonding portion 30, and the semiconductor element 40. The conductive portion 20 includes the first conductive portion 21 and the second conductive portion 22. As shown in FIG. 6, the sealing resin 10 is filled between the first conductive portion 21 and the second conductive portion 22 in a cross section along the Z direction. The sealing resin 10 includes a first resin portion 131 and a second resin portion 132. The first resin portion 131 is a resin filled between the first terminal portion 23 of the first conductive portion 21 and the second terminal portion 25 of the second conductive portion 22. The second resin portion 132 is a resin filled between the first mounting portion 24 of the first conductive portion 21 and the second mounting portion 26 of the second conductive portion 22. The first resin portion 131 and the second resin portion 132 are integrally formed. The first resin portion 131 and the second resin portion 132 are made of the same material. No interface is formed between the first resin portion 131 and the second resin portion 132. That is, the first resin portion 131 and the second resin portion 132 are integrally formed without an interface formed therebetween.

[Method of Manufacturing Semiconductor Device]

An example of a method of manufacturing the semiconductor device 1A according to an embodiment of the present disclosure will be described with reference to FIGS. 8 to 22. Each figure referred to shows a range in which one semiconductor device 1A is formed. FIGS. 8 to 22 show sections corresponding to FIG. 6 in the manufacturing process. For ease of understanding, in FIGS. 8 to 22, the same constituent elements as those in FIGS. 1 to 7 are denoted by the same reference numerals. Further, definition of each direction shown in each figure is the same as that of each direction shown in FIGS. 1 to 7.

Figure 8:
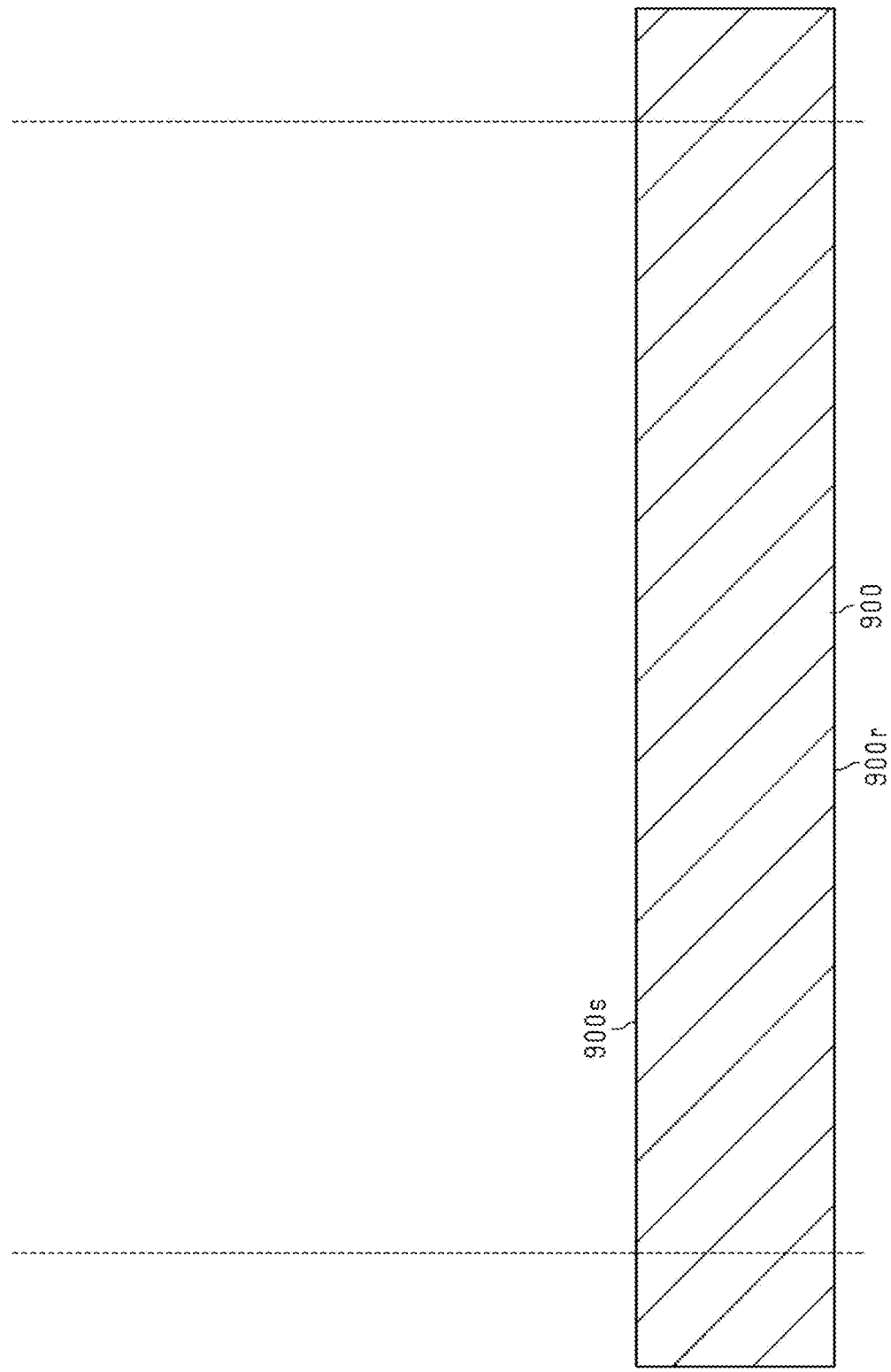
FIG. 8 is a schematic cross-sectional view showing an exemplary manufacturing process of the semiconductor device shown in FIG. 6.

As shown in FIG. 8, the method of manufacturing the semiconductor device 1A includes a step of providing a support substrate 900. The support substrate 900 is made of, for example, a Si single crystal material. The support substrate 900 has a main surface 900s and a back surface 900r facing opposite sides from each other in the Z direction. As the support substrate 900, a substrate made of a synthetic resin material such as an epoxy resin may be used.

Figure 9:
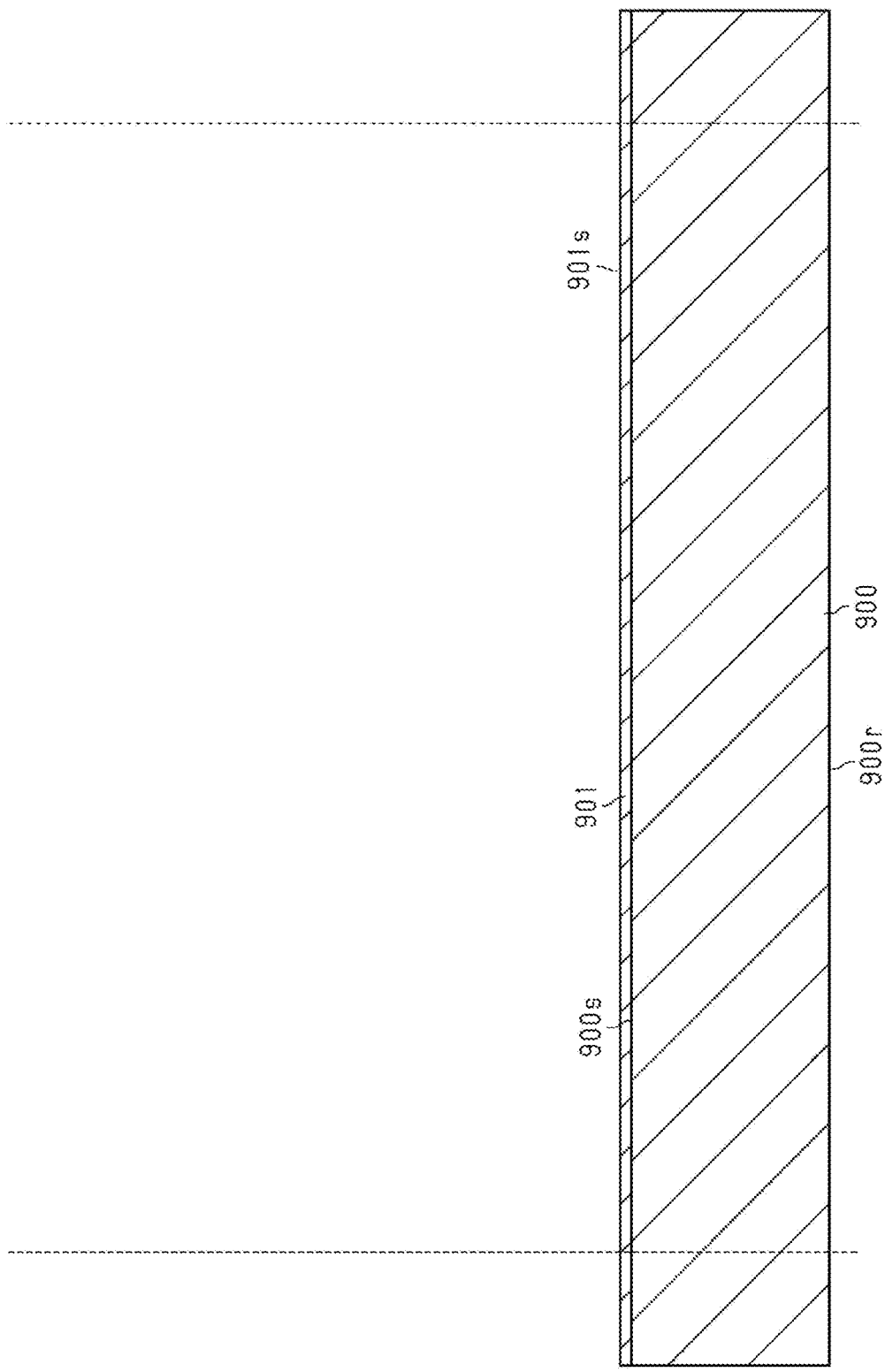
FIG. 9 is a schematic cross-sectional view showing a manufacturing process subsequent to FIG. 8.

As shown in FIG. 9, the method of manufacturing the semiconductor device 1A includes a step of forming a seed layer 901. For example, the seed layer 901 is formed on the main surface 900s of the support substrate 900 by a sputtering method. The seed layer 901 includes, for example, a first layer containing Ti as a main component and a second layer containing Cu as a main component. The first layer is formed on the entire surface of the main surface 900s of the support substrate 900, and the second layer is formed in contact with the first layer.

Figure 10:
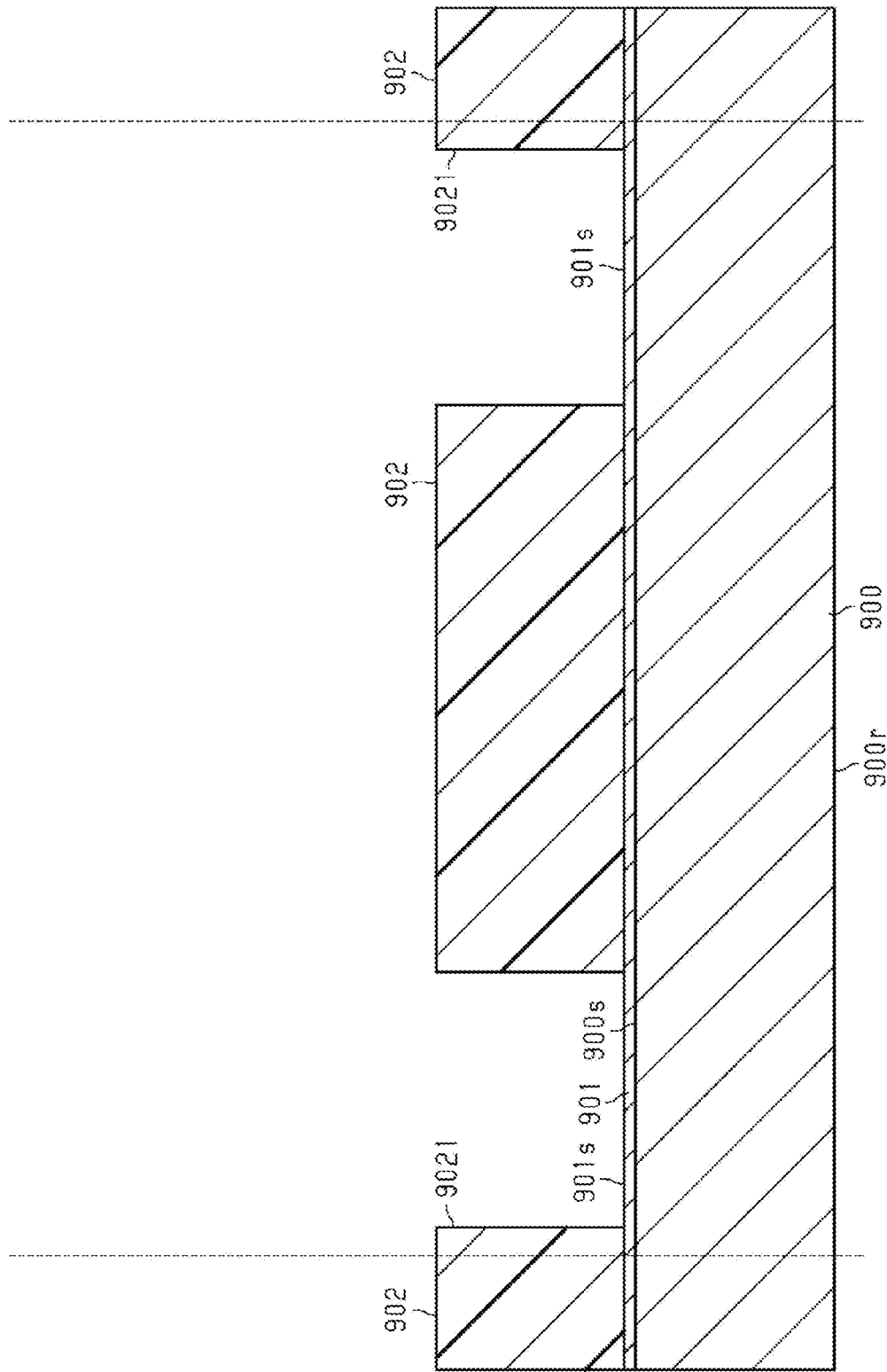
FIG. 10 is a schematic cross-sectional view showing a manufacturing process subsequent to FIG. 9.

As shown in FIG. 10, the method of manufacturing the semiconductor device 1A includes a step of forming a first mask 902. The first mask 902 forms the terminal portions 23 and 25 shown in FIG. 6 and the like. The first mask 902 has first openings 9021 corresponding to the terminals 23 and 25. The first mask 902 is formed by, for example, photolithography. The film thickness of the first mask 902 is larger than the thicknesses T23 and T25 (see FIG. 6) of the terminal portions 23 and 25 formed by the first mask 902. First, for example, a photosensitive resist layer is formed on the upper surface 901s of the seed layer 901. As the resist layer, for example, a dry film resist may be used. The resist layer may include a plurality of dry film resists. Next, by exposing and developing the resist layer, the first mask 902 having the first openings 9021 corresponding to the terminal portions 23 and 25 shown in FIG. 6 is formed.

Figure 11:
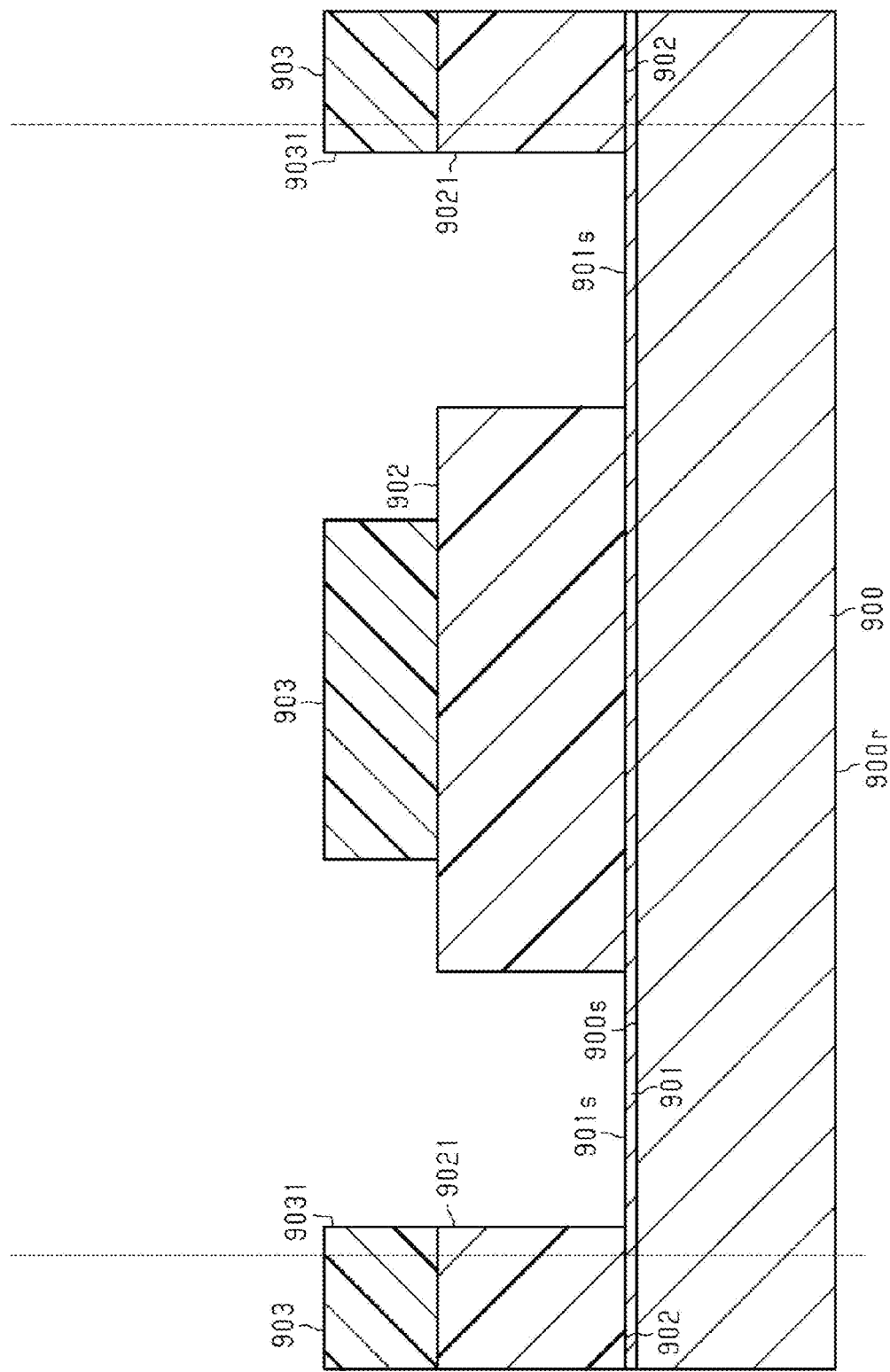
FIG. 11 is a schematic cross-sectional view showing a manufacturing process subsequent to FIG. 10.

As shown in FIG. 11, the method of manufacturing the semiconductor device 1A includes a step of forming a second mask 903. The second mask 903 forms the mounting portions 24 and 26 shown in FIG. 6. The second mask 903 has second openings 9031 corresponding to the mounting portions 24 and 26. The second mask 903 is formed by, for example, photolithography. The film thickness of the second mask 903 is larger than the thicknesses T24 and T26 (see FIG. 6) of the mounting portions 24 and 26 formed by the second mask 903. First, for example, a photosensitive resist layer is formed on an upper surface of the first mask 902. As the resist layer, for example, a dry film resist may be used. The resist layer may include a plurality of dry film resists. Next, by exposing and developing the resist layer, the second mask 903 having the second openings 9031 corresponding to the mounting portions 24 and 26 shown in FIG. 6 is formed.

Figure 12:
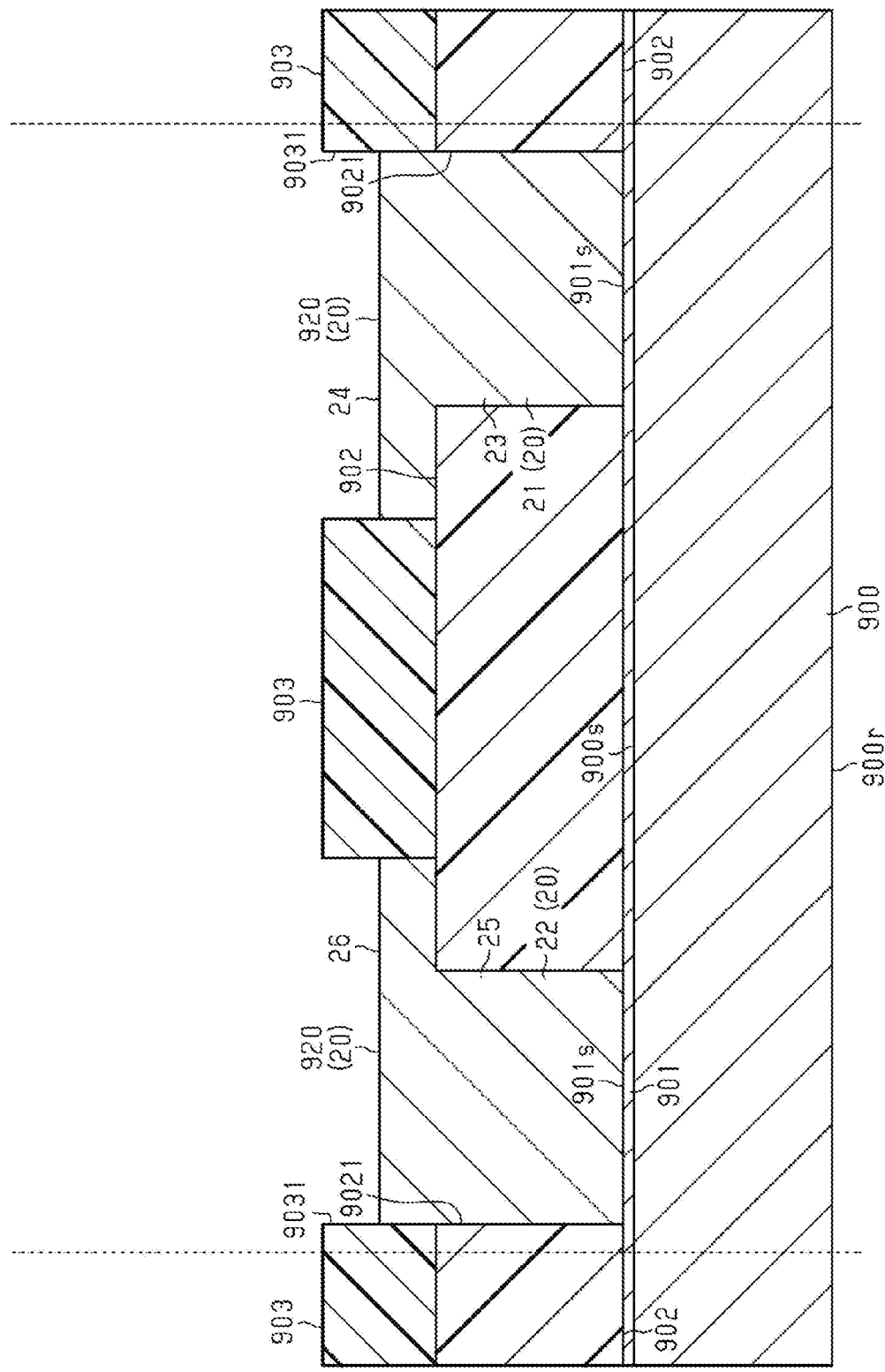
FIG. 12 is a schematic cross-sectional view showing a manufacturing process subsequent to FIG. 11.

As shown in FIG. 12, the method of manufacturing the semiconductor device 1A includes a step of forming a plating layer 920. The plating layer 920 corresponds to the conductive portion 20 shown in FIG. 6. The conductive portion 20 includes the plating layer 920.

The plating layer 920 is formed by, for example, an electrolytic plating method. The plating layer 920 is formed by growing plating metal from the upper surface 901s of the seed layer 901 exposed from the first mask 902 and the second mask 903. In this step, the plating metal is collectively grown from the first opening 9021 of the first mask 902 to the second opening 9031 of the second mask 903. The plating metal constituting the plating layer 920 contains Cu and a Cu alloy. As a result, the plating layer 920 includes the terminal portions 23 and 25 formed in the first opening 9021 of the first mask 902 and the mounting portions 24 and 26 formed in the second opening 9031 of the second mask 903. No interface is formed inside the conductive portion 20 including the plating layer 920.

Figure 13:
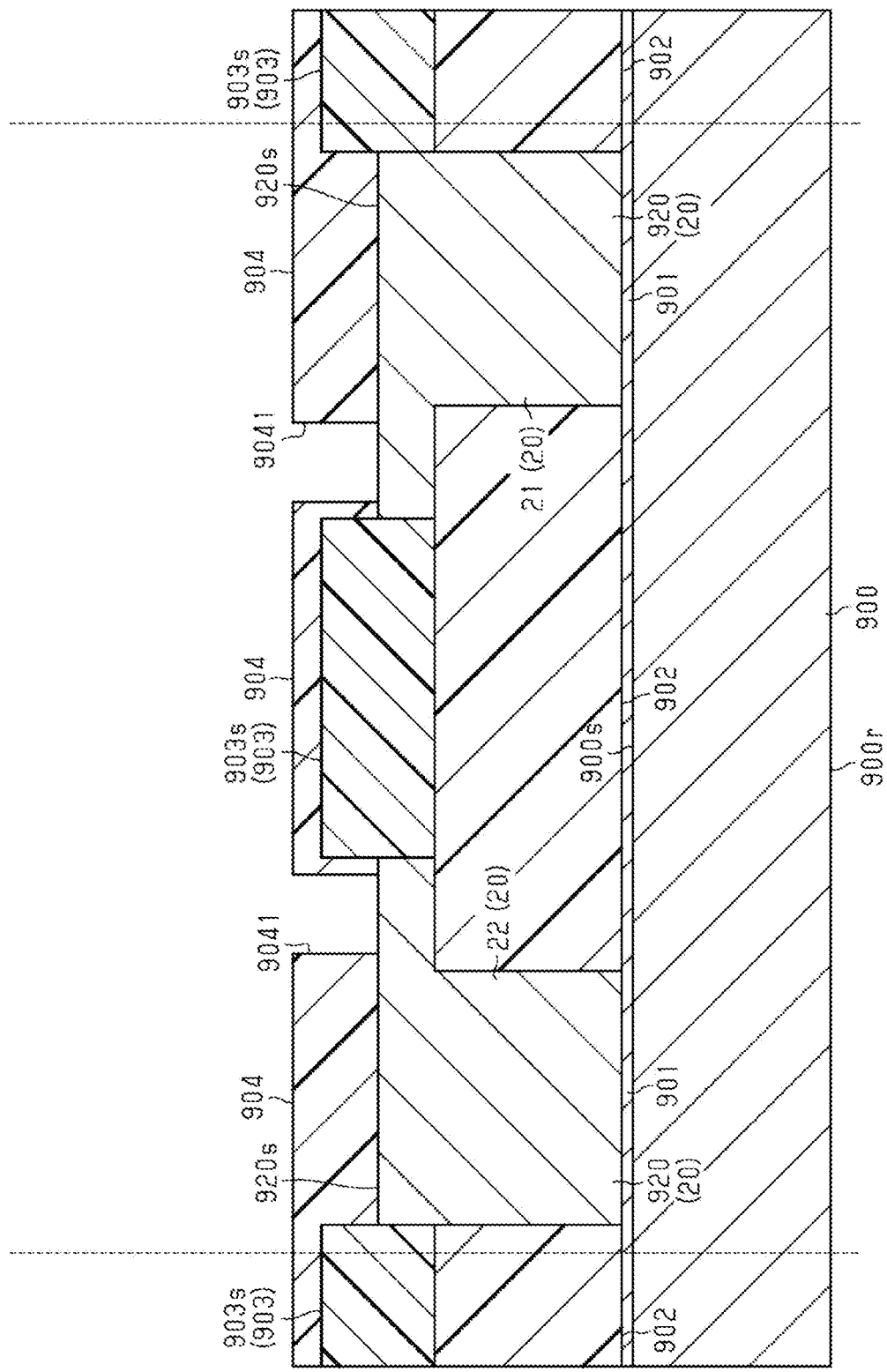
FIG. 13 is a schematic cross-sectional view showing a manufacturing process subsequent to FIG. 12.

As shown in FIG. 13, the method of manufacturing the semiconductor device 1A includes a step of forming a third mask 904. The third mask 904 forms the bonding portion 30 shown in FIG. 6. The third mask 904 has a third opening 9041 corresponding to the bonding portion 30. The third mask 904 is formed by, for example, photolithography. The film thickness of the third mask 904 is larger than the thickness of the bonding portion 30 formed by the third mask 904. First, for example, a photosensitive resist layer is formed on the upper surface 903s of the second mask 903 and the upper surface 920s of the plating layer 920. As the resist layer, for example, a dry film resist may be used. The resist layer may include a plurality of dry film resists. Next, by exposing and developing the resist layer, the third mask 904 having the third opening 9041 corresponding to the bonding portion 30 shown in FIG. 6 is formed.

Figure 14:
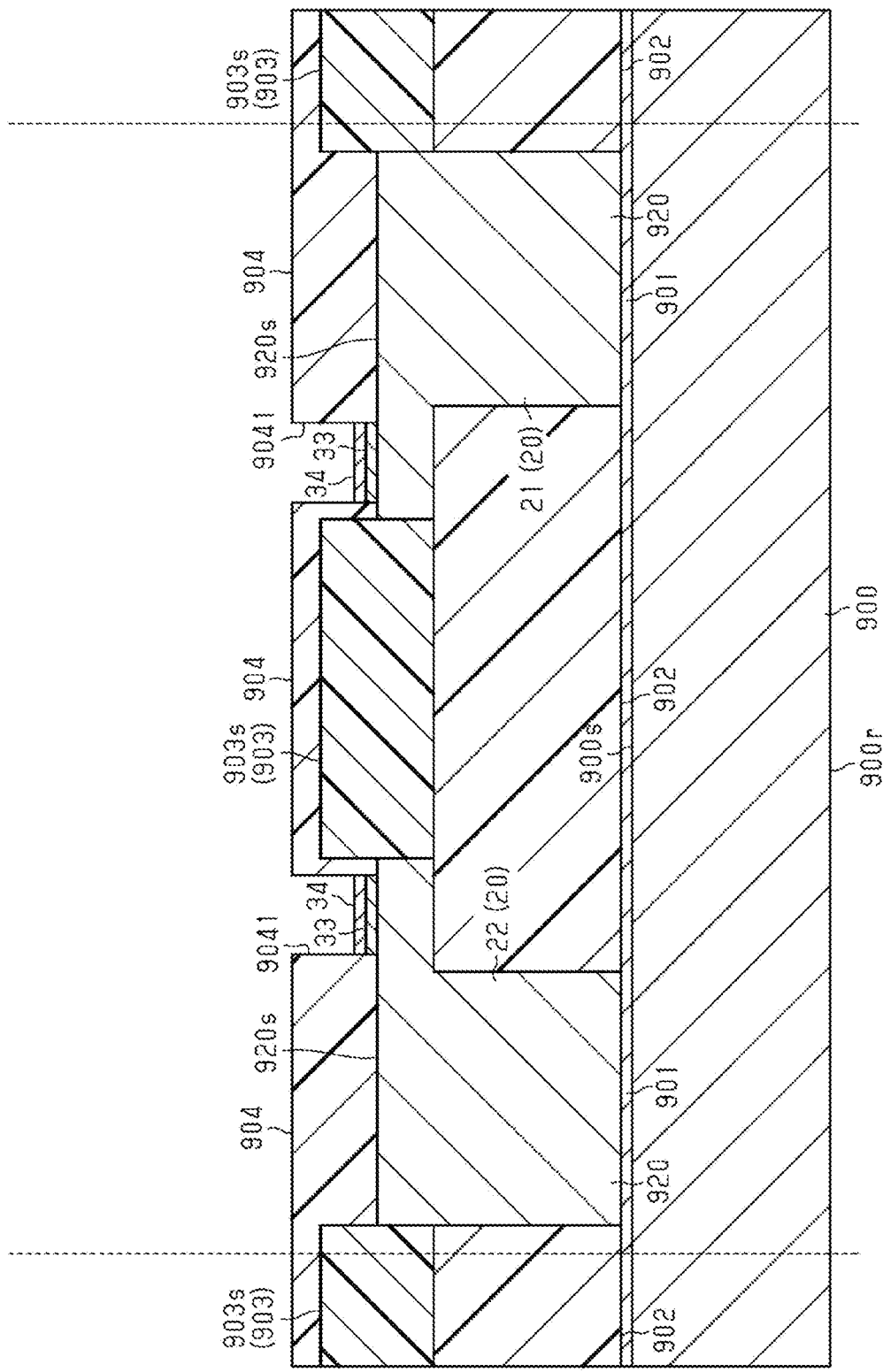
FIG. 14 is a schematic cross-sectional view showing a manufacturing process subsequent to FIG. 13.

As shown in FIG. 14, the method of manufacturing the semiconductor device 1A includes a step of forming the bonding portion 30. The bonding portion 30 includes the plating layer 33 and the solder layer 34. The bonding portion 30 is formed by, for example, an electrolytic plating method. First, the plating layer 33 is formed. The plating layer 33 is formed by precipitating plating metal on the upper surface 920s of the plating layer 920 exposed from the third mask 904. The plating metal constituting the plating layer 33 contains Ni and an Ni alloy. Next, the solder layer 34 is formed. The solder layer 34 is formed by precipitating plating metal on the upper surface of the plating layer 33 exposed from the third mask 904. The plating metal constituting the solder layer 34 contains Sn and an alloy containing Ag.

Figure 15:
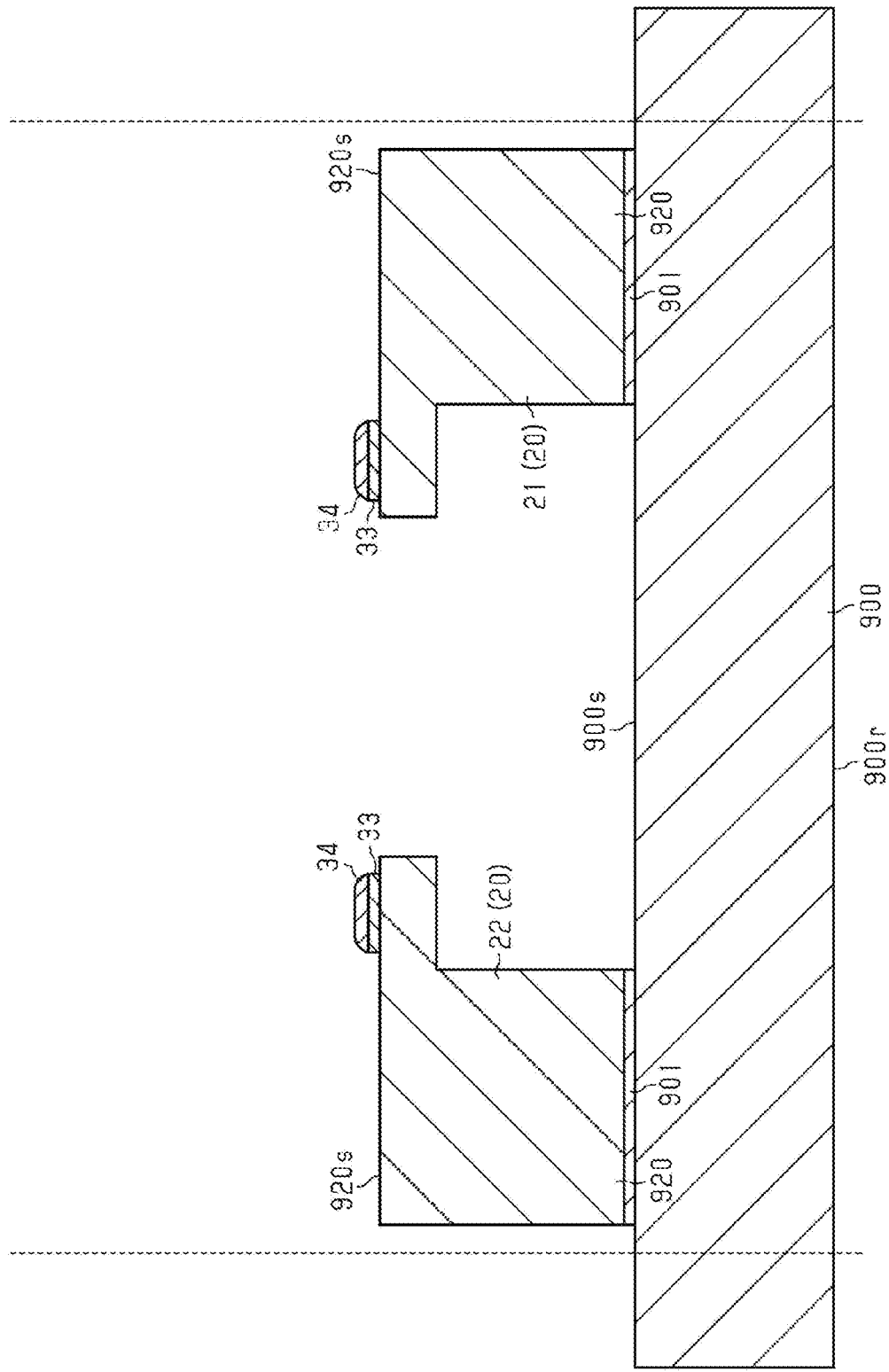
FIG. 15 is a schematic cross-sectional view showing a manufacturing process subsequent to FIG. 14.

As shown in FIG. 15, the method of manufacturing the semiconductor device 1A includes a step of removing the masks 902 to 904. The masks 902 to 904 may be removed by using, for example, a stripping solution.

Further, the method of manufacturing the semiconductor device 1A includes a step of removing the seed layer 901. After removing the masks 902 to 904 shown in FIG. 14, the exposed seed layer 901 is removed. The removal of the seed layer 901 may be performed by, for example, etching. For example, the seed layer 901 exposed from the plating layer 920 is removed by wet etching using the plating layer 920 as a mask.

Further, the method of manufacturing the semiconductor device 1A includes a step of performing a flow process. The surface of the solder layer 34 is smoothed by the flow process. This smoothing suppresses the generation of voids when the semiconductor element 40 is mounted.

Figure 16:
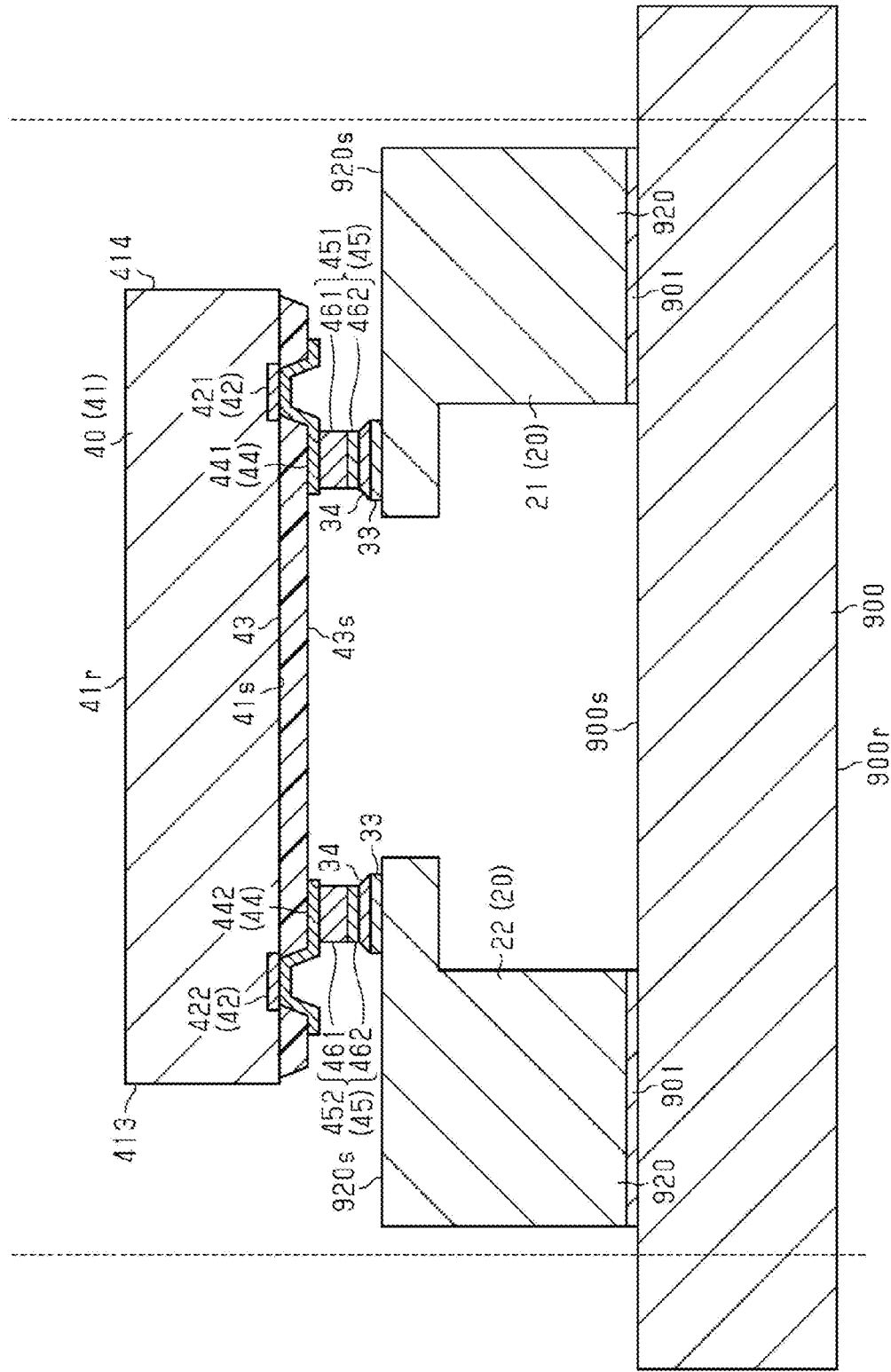
FIG. 16 is a schematic cross-sectional view showing a manufacturing process subsequent to FIG. 15.

As shown in FIG. 16, the method of manufacturing the semiconductor device 1A includes a step of mounting the semiconductor element 40. This step includes a step of flip-chip mounting the semiconductor element 40 and a step of reflowing. The semiconductor element 40 is flip-chip mounted by applying a flux to the element electrode 45 by using, for example, a flip chip bonder. Next, the element electrode 45 is bonded to the bonding portion 30 by the reflow process.

Figure 17:
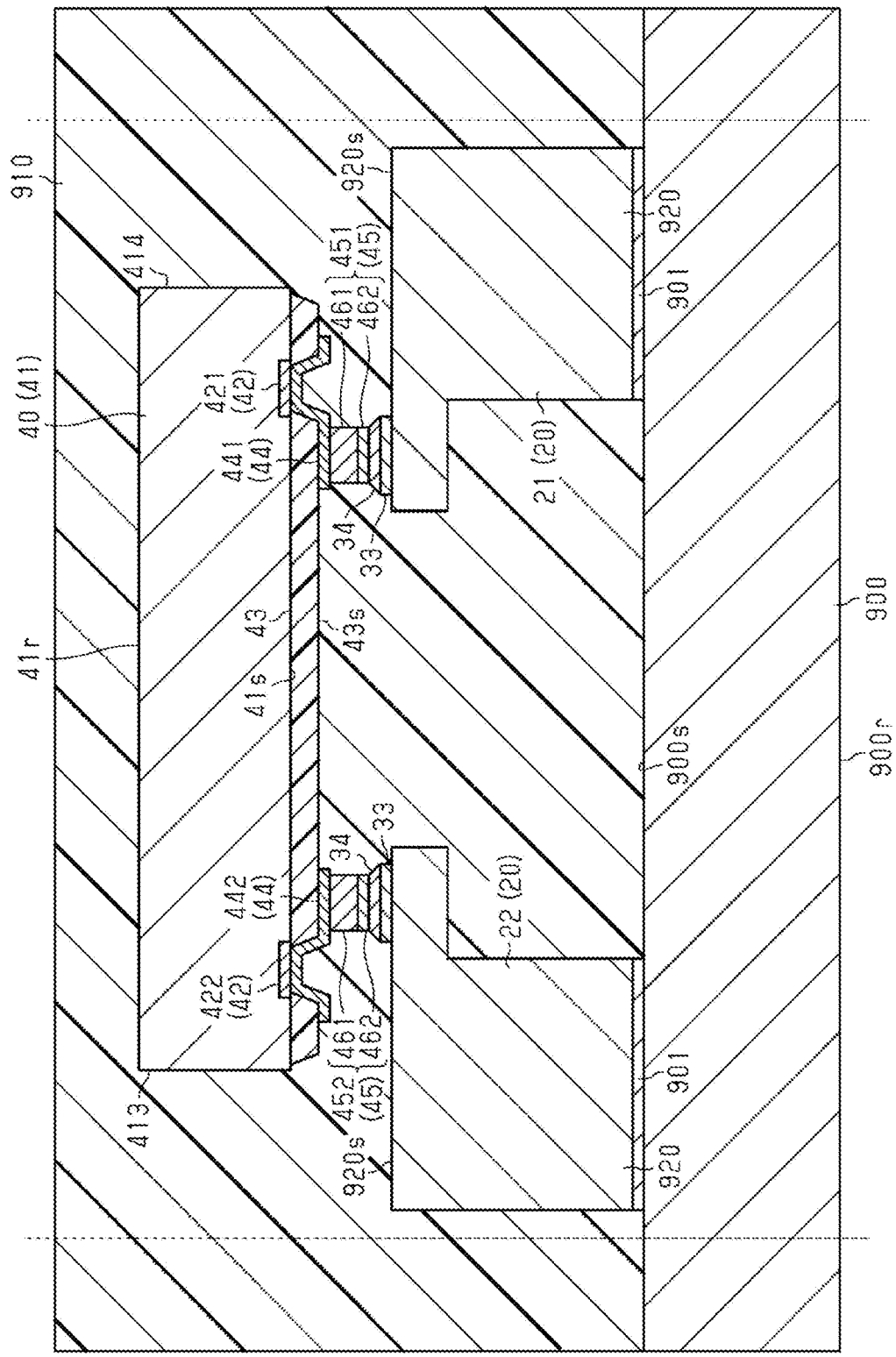
FIG. 17 is a schematic cross-sectional view showing a manufacturing process subsequent to FIG. 16.

As shown in FIG. 17, the method of manufacturing the semiconductor device 1A includes a step of forming a resin layer 910. The resin layer 910 is a portion to be the sealing resin 10 shown in FIGS. 1 to 7. The resin layer 910 is, for example, a synthetic resin containing an epoxy resin as a main material. The resin layer 910 is formed by, for example, compression molding. The resin layer 910 is formed to cover the semiconductor element 40, the bonding portion 30, and the conductive portion 20. That is, the resin layer 910 is filled between the first conductive portion 21 and the second conductive portion 22 of the conductive portion 20.

Figure 18:
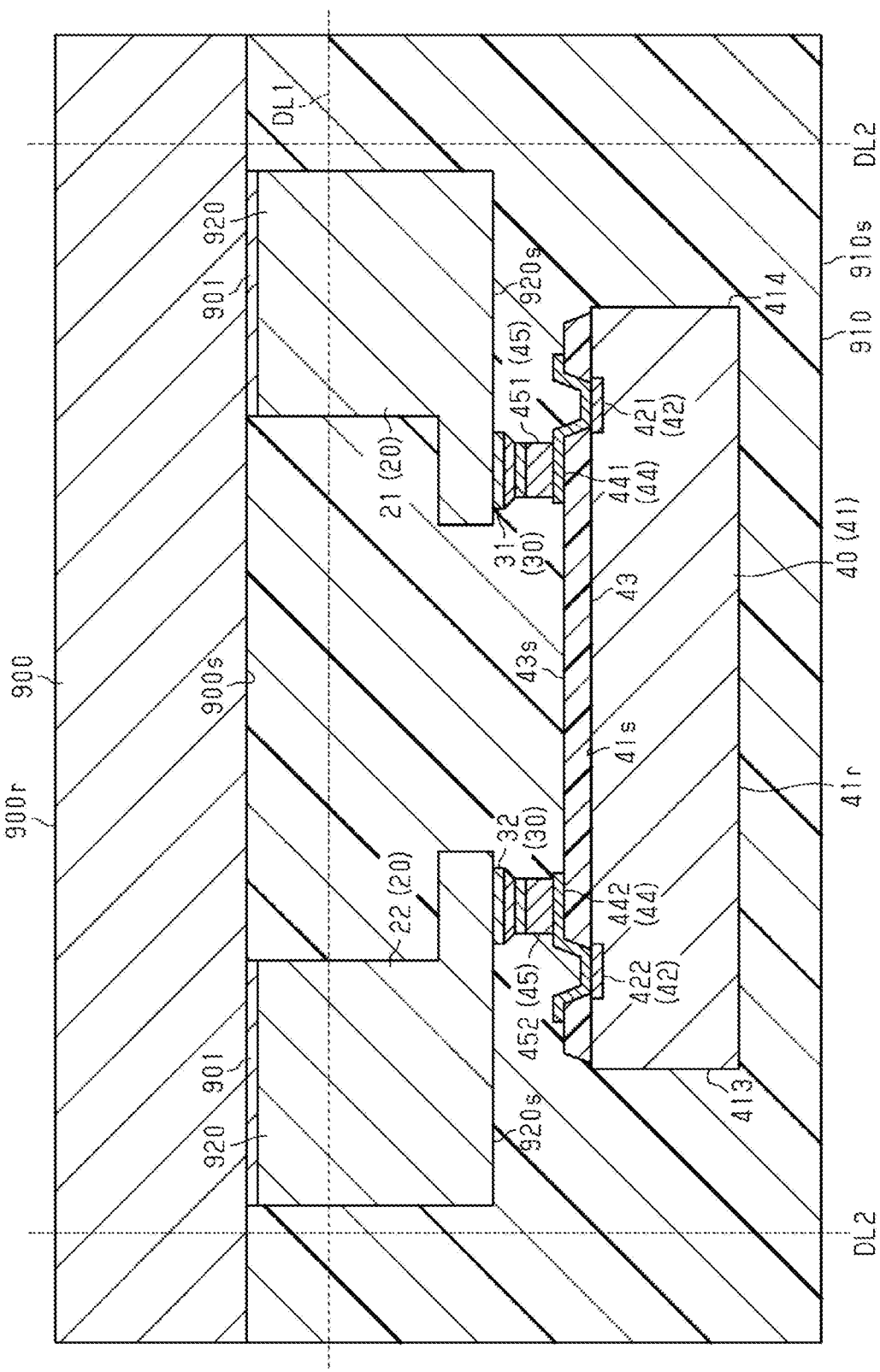
FIG. 18 is a schematic cross-sectional view showing a manufacturing process subsequent to FIG. 17.
Figure 19:
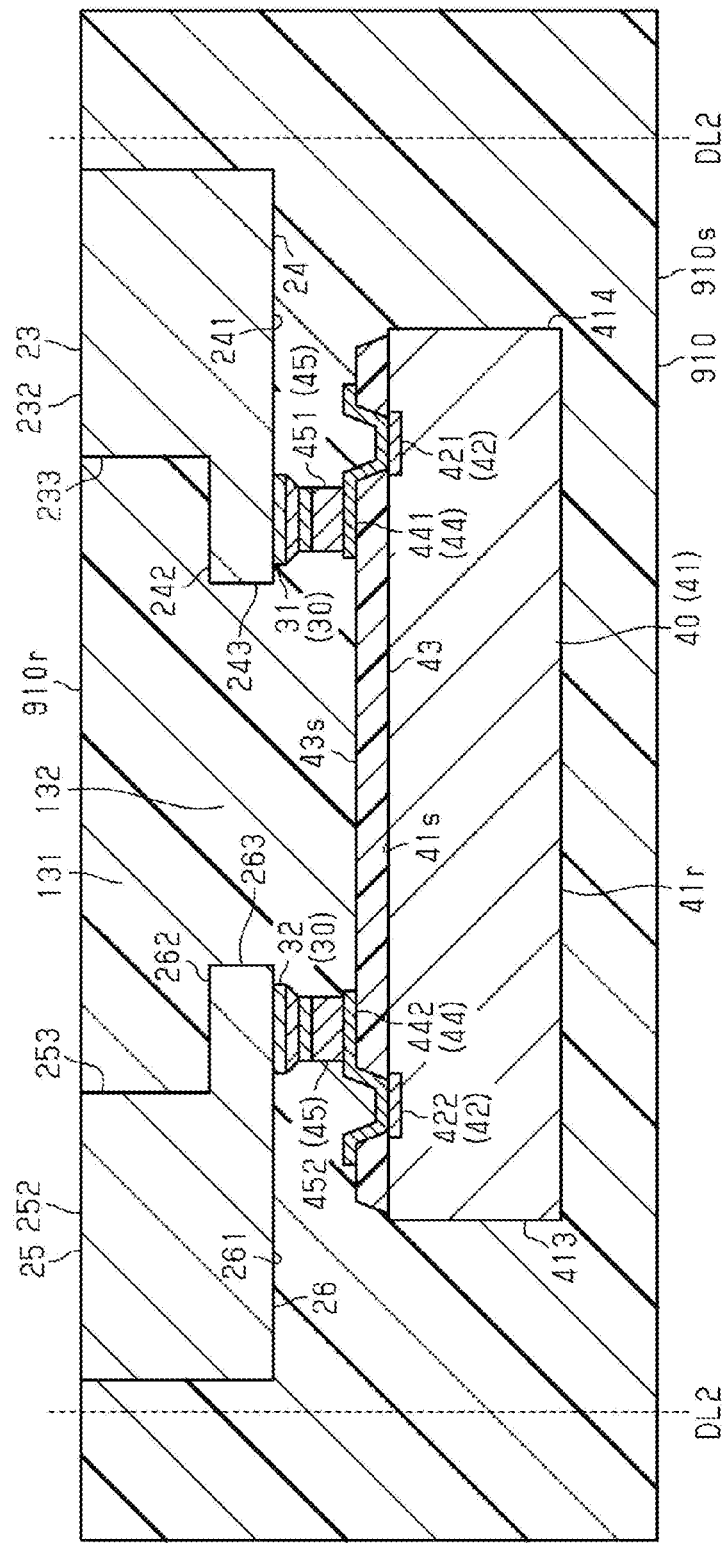
FIG. 19 is a schematic cross-sectional view showing a manufacturing process subsequent to FIG. 18.

As shown in FIGS. 18 and 19, the method of manufacturing the semiconductor device 1A includes a step of removing the support substrate 900. A dicing tape (not shown) is attached to the lower surface 910s of the resin layer 910. Note that FIG. 18 is shown upside down with respect to FIG. 17. Then, the support substrate 900, the seed layer 901, a portion of the resin layer 910, and a portion of the plating layer 920 are removed by grinding. At this time, the grinding is performed from the side of the support substrate 900 toward the resin layer 910 to a broken line DL1 shown in FIG. 18. As a result, as shown in FIG. 19, the lower surfaces 232 and 252 of the terminal portions 23 and 25 are formed. After peeling the support substrate 900 from the resin layer 910, a portion of the resin layer 910, the seed layer 901, and a portion of the plating layer 920 may be ground.

Figure 20:
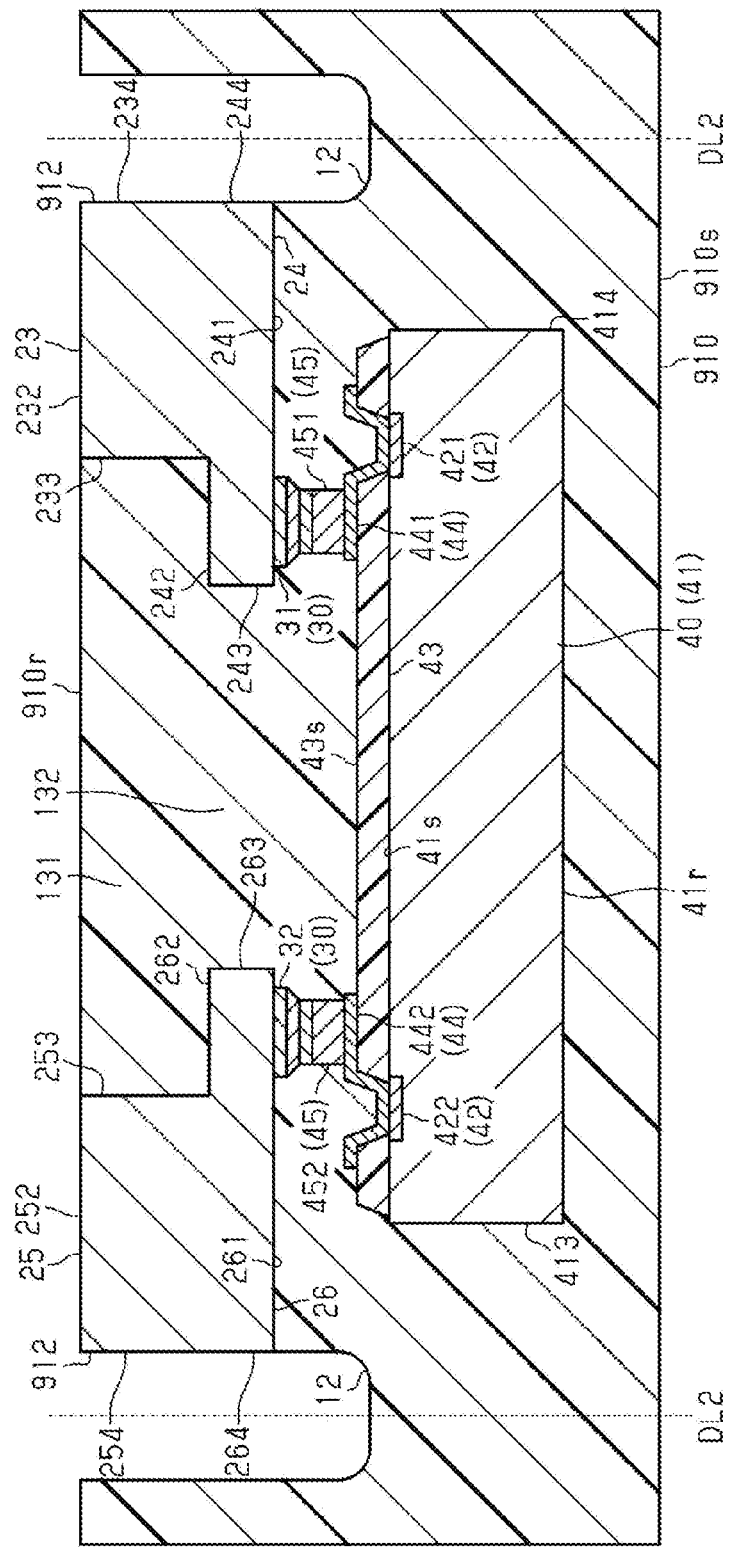
FIG. 20 is a schematic cross-sectional view showing a manufacturing process subsequent to FIG. 19.

As shown in FIG. 20, the method of manufacturing the semiconductor device 1A includes a step of cutting (half-cutting) a portion of the resin layer 910 in the Z direction. In such half-cutting of the resin layer 910, for example, a dicing blade is used to cut along a cutting line (broken line) DL2 shown in FIG. 20 from the upper surface 910r of the resin layer 910 toward the lower surface 910s of the resin layer 910. By half-cutting the resin layer 910 in this way, a separation groove 912 is formed in the resin layer 910. Then, the conductive portion 20 is formed by half-cutting the resin layer 910 with the dicing blade. More specifically, the side surfaces 234 and 254 of the terminal portions 23 and 25 and the side surfaces 244 and 264 of the mounting portions 24 and 26 are formed. The side surfaces 234 and 254 of the terminal portions 23 and 25 and the side surfaces 244 and 264 of the mounting portions 24 and 26 are exposed to the separation groove 912.

Figure 21:
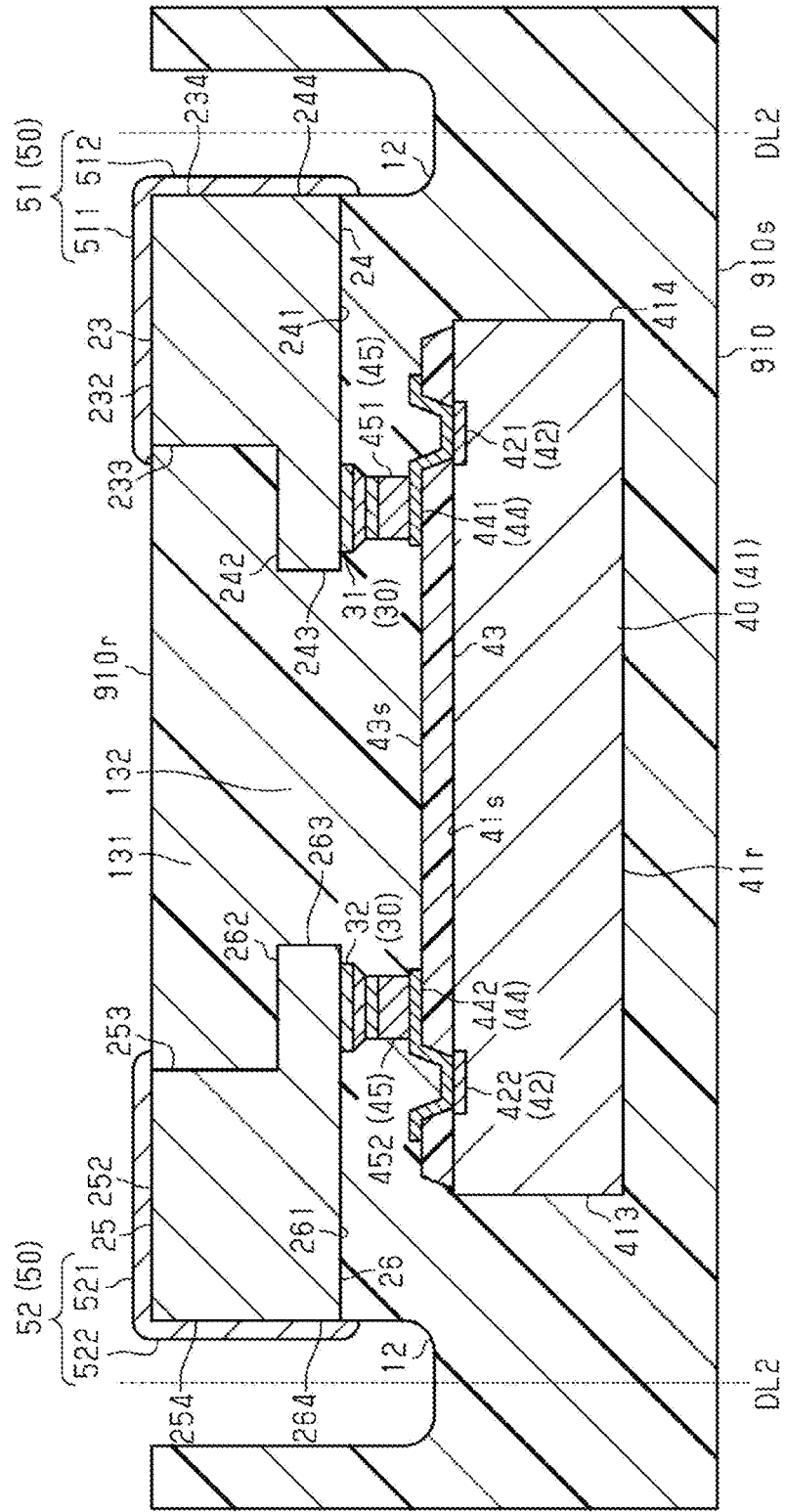
FIG. 21 is a schematic cross-sectional view showing a manufacturing process subsequent to FIG. 20.

As shown in FIG. 21, the method of manufacturing the semiconductor device 1A includes a step of forming the external conductive film 50. The external conductive film 50 includes the first conductive films 511 and 521 that cover the lower surfaces 232 and 252 of the terminal portions 23 and 25, and the second conductive films 512 and 522 that cover the side surfaces 234 and 254 of the terminal portions 23 and 25 and the side surfaces 244 and 264 of the mounting portions 24 and 26. The second conductive films 512 and 522 are formed in the separation groove 912. The external conductive film 50 is made of plating metal. For example, the external conductive film 50 is formed by precipitating plating metals such as Ni, Pd, and Au in this order by an electroless plating method. The configuration and the forming method of the external conductive film 50 are not limited to the above method.

Figure 22:
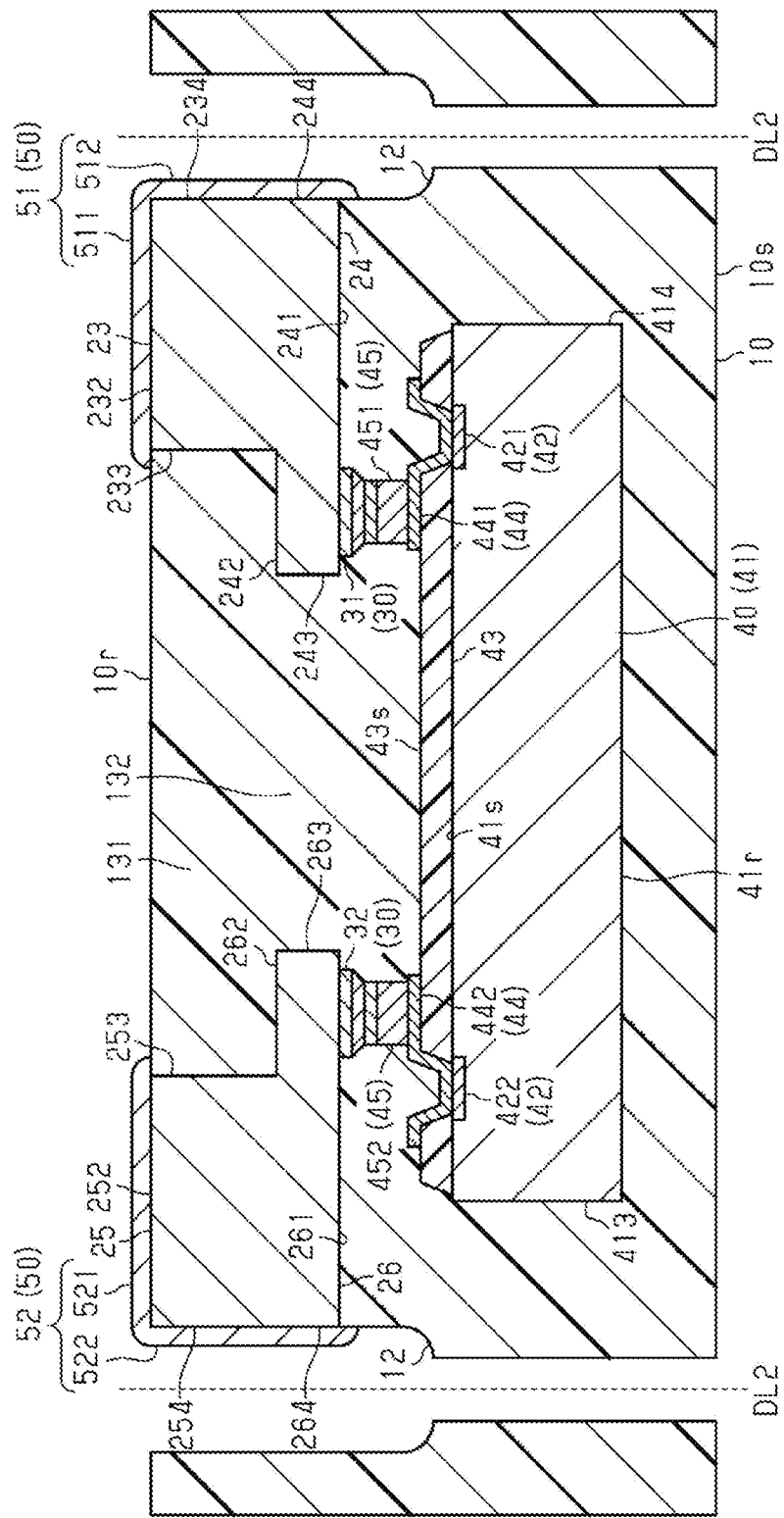
FIG. 22 is a schematic cross-sectional view showing a manufacturing process subsequent to FIG. 21.

As shown in FIG. 22, the method of manufacturing the semiconductor device 1A includes a step of individualizing the semiconductor device 1A. The resin layer 910 is cut and divided into individual pieces with the semiconductor element 40 as one unit. In the division, the resin layer 910 is cut by cutting from the separation groove 912 of the resin layer 910 to the lower surface 910s of the resin layer 910 along a cutting line (broken line) DL2 with, for example, a dicing blade having a width narrower than that of the dicing blade half-cutting the resin layer 910. The individual piece is the semiconductor device 1A including the sealing resin 10. As a result, the sealing resin 10 is formed. More specifically, the first side surface 111 and the second side surface 112 are formed as the sealing resin 10. In other words, the step 12 of the sealing resin 10 is formed by cutting the resin layer 910 up to the lower surface 910s of the resin layer 910 with a dicing blade having a width narrower than that of the dicing blade half-cutting the resin layer 910. The semiconductor device 1A is manufactured through the above-described steps.

(Operation)

Next, the operation of the semiconductor device 1A of the present embodiment will be described. The semiconductor device 1A of the present embodiment includes the conductive portion 20 and the semiconductor element 40 mounted on the conductive portion 20. The conductive portion 20 includes the plating layer. The conductive portion 20 includes the mounting portions 24 and 26 having the mounting surfaces 241 and 261 on which the semiconductor element 40 is mounted, and the terminal portions 23 and 25 extending to the opposite side of the semiconductor element 40 with respect to the mounting portions 24 and 26. The mounting portions 24 and 26 extend in the X direction along the mounting surfaces 241 and 261 further than the terminal portions 23 and 25. The mounting portions 24 and 26 and the terminal portions 23 and 25 are integrally formed. That is, the conductive portion 20 of the present embodiment does not include an interface.

Here, a semiconductor device 1R of a comparative example with respect to the semiconductor device 1A of the present embodiment will be described. The components of the semiconductor device 1R of the comparative example will be described with the same reference numerals as those of the semiconductor device 1A of the present embodiment.

Figure 23:
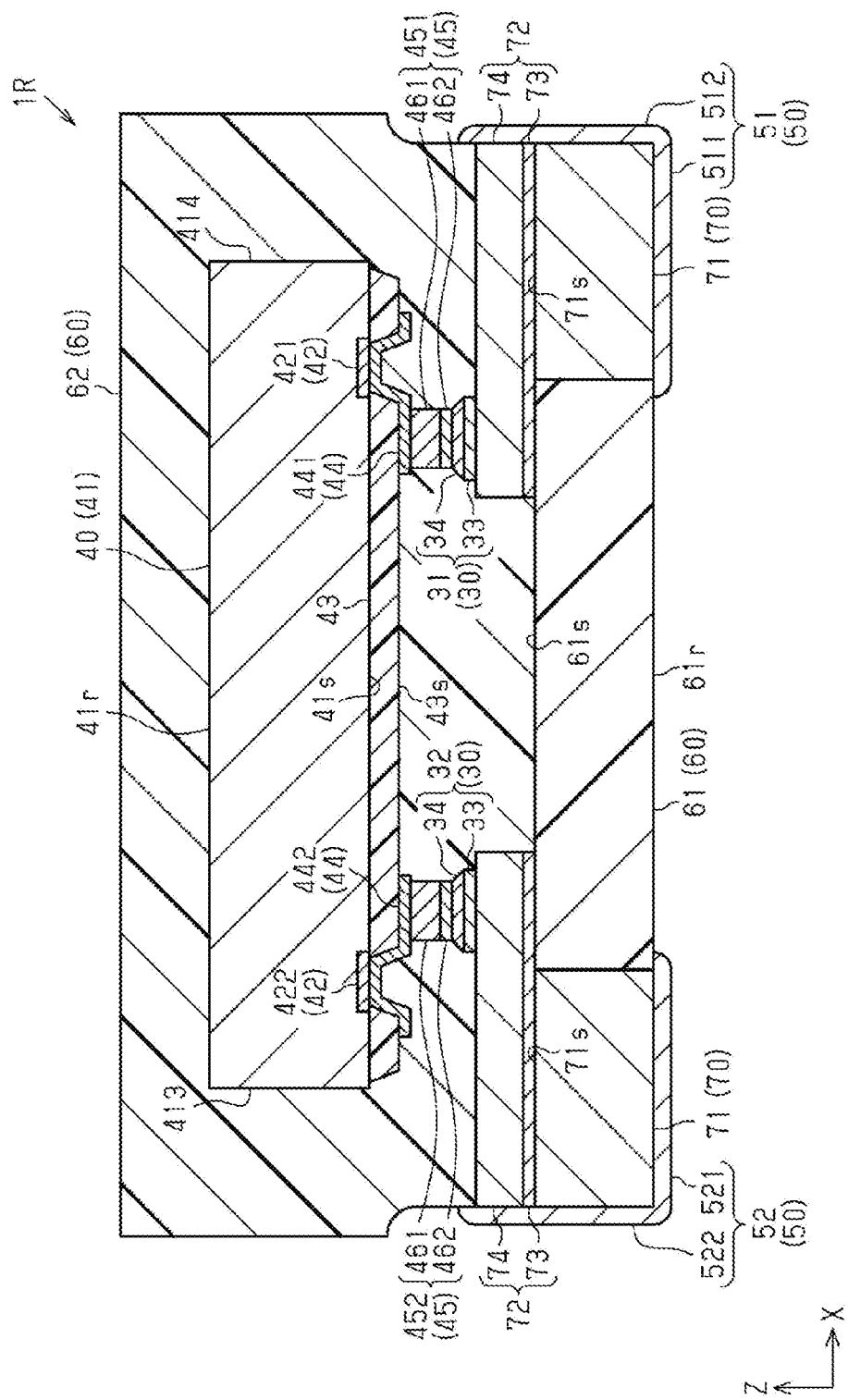
FIG. 23 is a cross-sectional view showing a semiconductor device of a comparative example.

FIG. 23 shows a cross section of the semiconductor device 1R of the comparative example. A sealing resin 60 of the semiconductor device 1R includes a first resin layer 61 and a second resin layer 62 that covers the upper surface 61s of the first resin layer 61 and seals a conductive portion 70 and a semiconductor element 40. The conductive portion 70 includes a terminal portion 71 that penetrates the first resin layer 61 from the upper surface 61s to the lower surface 61r, and a mounting portion 72 that is connected to the upper surface 71s of the terminal portion 71 and is provided on the upper surface 61s of the first resin layer 61. The mounting portion 72 includes a first metal layer 73 formed on the upper surface 71s of the terminal portion 71 and the upper surface 61s of the first resin layer 61, and a second metal layer 74 formed on the upper surface of the first metal layer 73.

The terminal portion 71 and the second metal layer 74 contain Cu and a Cu alloy. The first metal layer 73 is formed as a seed layer forming the second metal layer 74. The first metal layer 73 includes a Ti layer. A bonding portion 30 is formed on the upper surface of the mounting portion 72. The semiconductor element 40 is mounted on the mounting portion 72 by the bonding portion 30. The semiconductor device 1R includes an external conductive film 50 that covers the surface of the conductive portion 70 exposed from the first resin layer 61.

Figure 24:
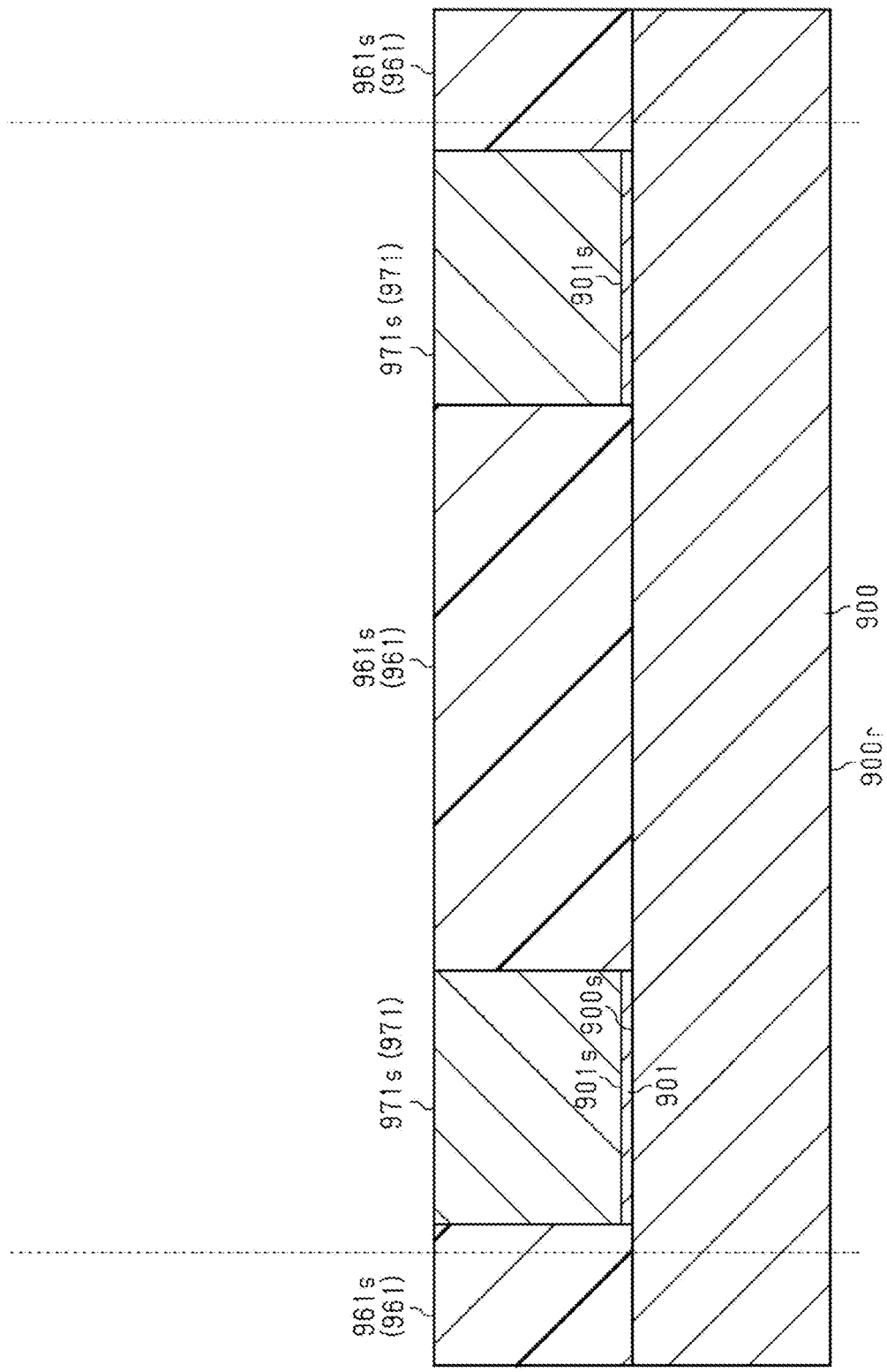
FIG. 24 is a schematic cross-sectional view showing a manufacturing process of a semiconductor device of a comparative example.

An outline of a process of manufacturing this semiconductor device 1R will be described. As shown in FIG. 24, a terminal portion 971 and a first resin layer 961 are formed. First, as in the above embodiment, a seed layer 901 is formed on the main surface 900s of a support substrate 900, a mask having an opening is formed on the seed layer 901, and a metal pillar serving as the terminal portion 971 is formed in the opening of the mask. After removing the mask and the exposed seed layer, a resin layer covering the metal pillar is formed, and the metal pillar and the resin layer are cut to form the upper surface 961s of the first resin layer 961 and the upper surface 971s of the terminal portion 971.

Figure 25:
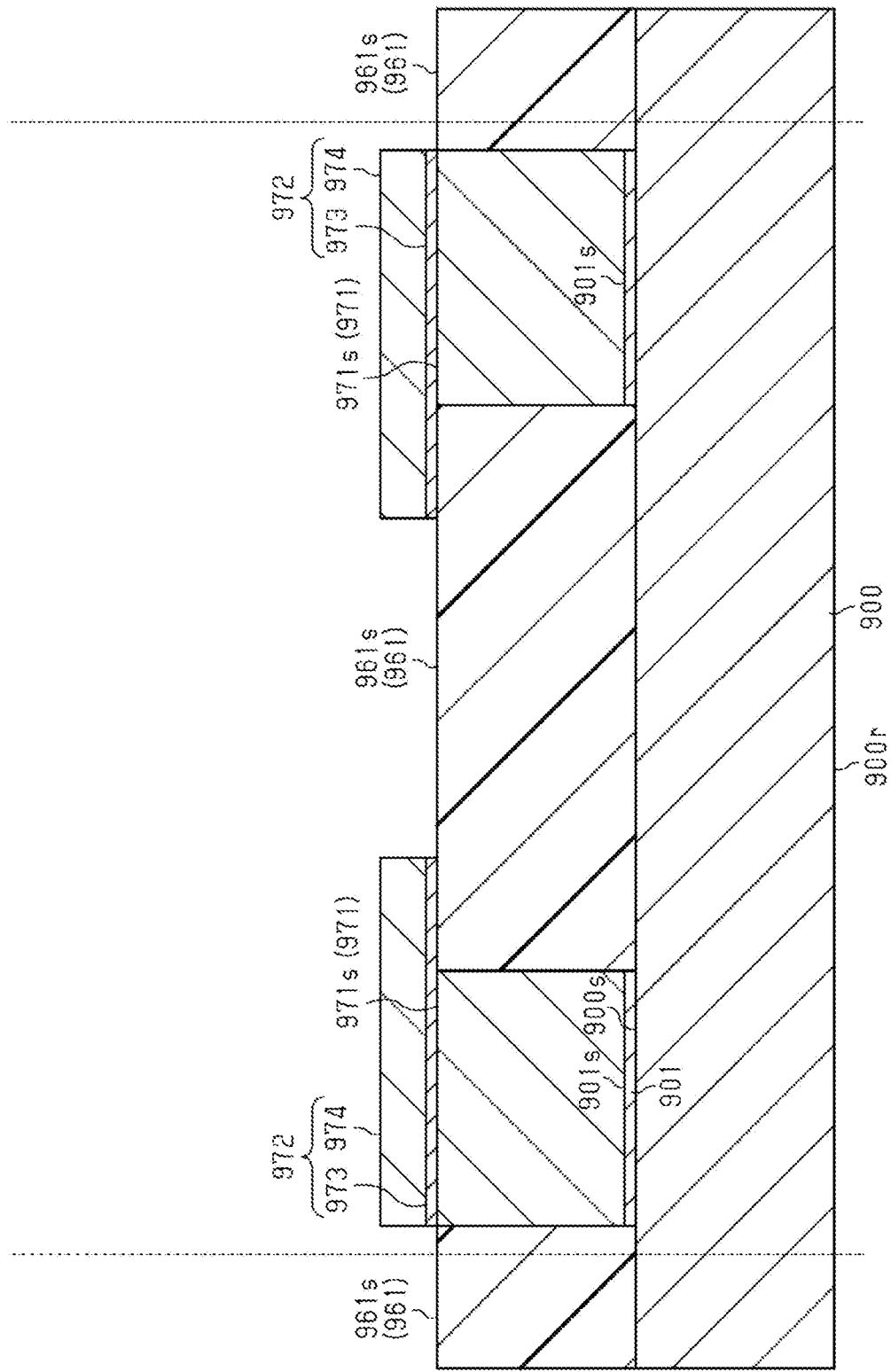
FIG. 25 is a schematic cross-sectional view showing a manufacturing process of the semiconductor device of the comparative example.

As shown in FIG. 25, a mounting portion 972 is formed. First, a seed layer is formed on the upper surface 961s of the first resin layer 961 and the upper surface 971s of the terminal portion 971. This seed layer includes a Ti layer serving as the first metal layer 73, and a Cu layer. The seed layer is formed by, for example, a sputtering method. The seed layer is covered to form a mask having an opening, and a second metal layer 974 is formed in the opening of the mask. After removing the mask, the seed layer exposed from the second metal layer 974 is removed to form the mounting portion 972 including the first metal layer 973 and the second metal layer 974.

Figure 26:
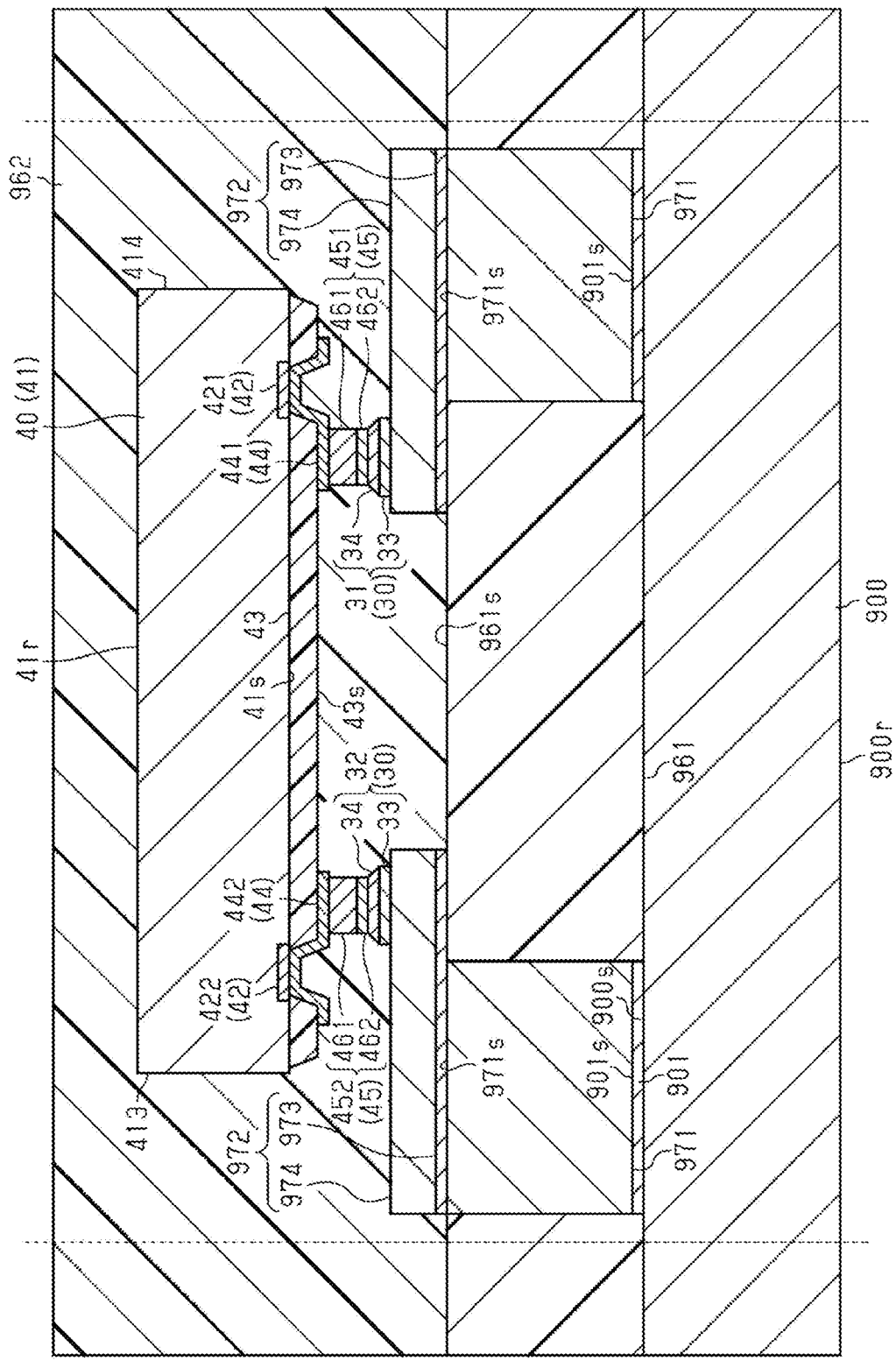
FIG. 26 is a schematic cross-sectional view showing a manufacturing process of the semiconductor device of the comparative example.

As shown in FIG. 26, a bonding portion 30 is formed on the mounting portion 972, and the semiconductor element 40 is mounted on the mounting portion 972 by the bonding portion 30. Then, the upper surface 961s of the first resin layer 961 is covered to form the second resin layer 962 sealing the mounting portion 972, the bonding portion 30, and the semiconductor element 40.

Figure 27:
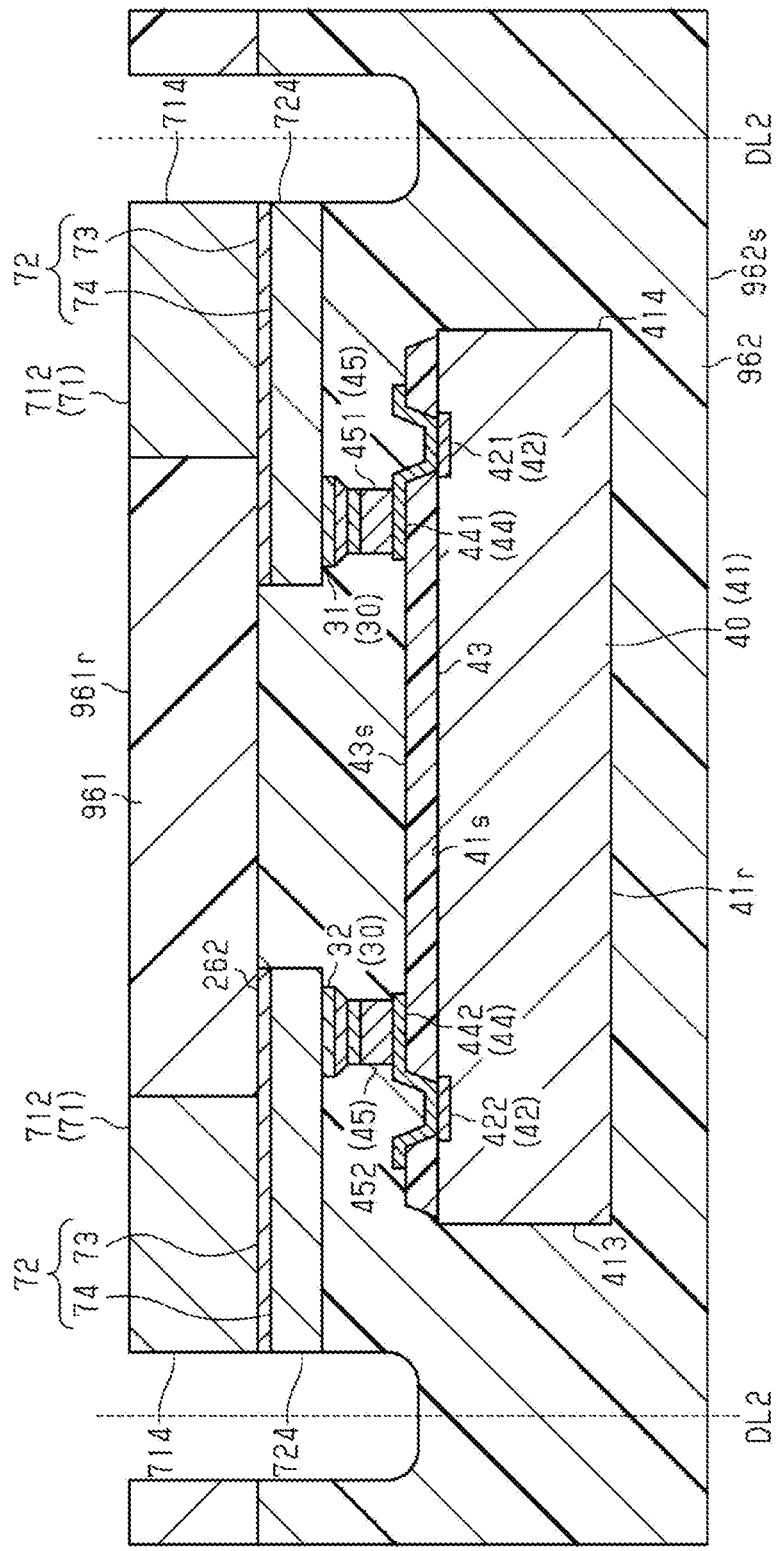
FIG. 27 is a schematic cross-sectional view showing a manufacturing process of the semiconductor device of the comparative example.

As shown in FIG. 27, the support substrate 900 and the seed layer 901 shown in FIG. 26 are removed, and the first resin layer 961 is ground to form the lower surface 961r of the first resin layer 961 and the lower surface 712 of the terminal portion 71. Then, a separation groove is formed from the lower surface 961r of the first resin layer 961 toward the upper surface 962s of the second resin layer 962 to expose the side surfaces 714 and 724 of the terminal portion 71 and the mounting portion 72.

Next, as in the above embodiment, the external conductive film 50 that covers the exposed surface (the lower surface 712 and the side surface 714) of the terminal portion 71 and the side surface 724 of the mounting portion 72 is formed. Then, the second resin layer 962 is cut in the separation groove 912 to form a piece including the semiconductor element 40, that is, the semiconductor device 1R of the comparative example shown in FIG. 23.

In the semiconductor device 1R of the comparative example shown in FIG. 23, the first resin layer 61 and the second resin layer 62 each include a filler. In the semiconductor device 1R including the first resin layer 61 and the second resin layer 62 in this way, an interface is generated between the first resin layer 61 and the second resin layer 62. This interface includes a filler processed by the step of forming the first resin layer 61 (grinding step), for example, a polished filler. The interface may be confirmed with such a filler.

Further, in the semiconductor device 1R of the comparative example shown in FIG. 23, the conductive portion 70 includes an interface. As described above, the conductive portion 70 includes the terminal portion 71 and the mounting portion 72, and the mounting portion 72 includes the first metal layer 73 and the second metal layer 74. The terminal portion 71 and the second metal layer 74 are made of Cu and Cu alloy, and the first metal layer 73 includes a Ti layer. Therefore, the conductive portion 70 of the comparative example includes an interface between the terminal portion 71 and the first metal layer 73 and an interface between the first metal layer 73 and the second metal layer 74.

In the semiconductor device 1R formed in this way, the conductive portion 70 is formed by a plurality of steps. Therefore, adhesion, that is, mechanical strength of the conductive portion 70, may be decreased among the terminal portion 71, the first metal layer 73, and the second metal layer 74 constituting the conductive portion 70. The decrease in adhesion is likely to occur due to, for example, oxidation of a surface serving as an interface. When the adhesion is decreased in this way, the conductive portion 70 including the interface may be peeled off at the interface.

In addition, the peeling may occur at the interface due to a load in the manufacturing process. For example, when the support substrate 900 and the seed layer 901 shown in FIG. 25 are removed, a load applied to the terminal portion 971 may cause peeling at the interface between the terminal portion 971 and the first metal layer 973. Further, in the step of forming the separation groove 912 shown in FIG. 26, a load applied by the dicing blade may cause peeling at the interface between the terminal portion 971 and the first metal layer 973.

In contrast, in the semiconductor device 1A of the present embodiment, the terminal portions 23 and 25 and the mounting portions 24 and 26 of the conductive portion 20 (the first conductive portion 21 and the second conductive portion 22) are integrally formed. That is, the conductive portion 20 of the present embodiment includes no interface. As a result, the conductive portion 20 (the first conductive portion 21 and the second conductive portion 22) has improved mechanical strength over the semiconductor device 1R of the comparative example. Therefore, it is possible to suppress occurrence of peeling between the terminal portions 23 and 25 and the mounting portions 24 and 26.

Further, in the semiconductor device 1A of the present embodiment, the sealing resin 10 contains a filler. In the sealing resin 10 of the present embodiment, a filler processed by a step is not included between the first resin portion 131 and the second resin portion 132. As a result, it may be confirmed that an interface is not formed between the first resin portion 131 and the second resin portion 132, that is, the first resin portion 131 and the second resin portion 132 are integrally formed. As a result, the sealing resin 10 has improved mechanical strength over the semiconductor device 1R of the comparative example.

In this semiconductor device 1A, when mounted on a circuit board, solder that connects the external conductive film 50 to a connection pad of the circuit board is interposed between the first conductive films 511 and 521 and the connection pad and also adheres to the second conductive films 512 and 522. That is, the solder in a liquid phase state by a reflow process extends over the second conductive films 512 and 522 to form a solder fillet between the second conductive films 512 and 522 and the connection pad. In this way, in the semiconductor device 1A, the solder fillet is formed more easily. With this solder fillet, the bonding area of the solder can be increased to further increase the connection strength. Further, the solder fillet allows a soldering state of the semiconductor device 1A to be confirmed from the outside.

(Effects)

As described above, according to the present embodiment, the following effects are obtained.

(1) The semiconductor device 1A includes the conductive portion 20 and the semiconductor element 40 mounted on the conductive portion 20. The conductive portion 20 includes the plating layer. The conductive portion 20 includes the mounting portions 24 and 26 having the mounting surfaces 241 and 261 on which the semiconductor element 40 is mounted, and the terminal portions 23 and 25 extending to the opposite side of the semiconductor element 40 with respect to the mounting portions 24 and 26. The mounting portions 24 and 26 extend in the X direction along the mounting surfaces 241 and 261 further than the terminal portions 23 and 25. The mounting portions 24 and 26 and the terminal portions 23 and 25 are integrally formed. That is, the conductive portion 20 of the present embodiment includes no interface. As a result, the mechanical strength of the conductive portion 20 (the first conductive portion 21 and the second conductive portion 22) may be improved. Therefore, it is possible to suppress occurrence of peeling between the terminal portions 23 and 25 and the mounting portions 24 and 26.

(2) In the semiconductor device 1A of the present embodiment, the sealing resin 10 includes a filler. In the sealing resin 10 of the present embodiment, a filler processed by a step is not included between the first resin portion 131 and the second resin portion 132. As a result, it may be confirmed that no interface is formed between the first resin portion 131 and the second resin portion 132, that is, the first resin portion 131 and the second resin portion 132 are integrally formed. As a result, the mechanical strength of the semiconductor device 1A of the present embodiment may be improved.

(3) In this semiconductor device 1A, when mounted on a circuit board, solder that connects the external conductive film 50 to a connection pad of the circuit board is interposed between the first conductive films 511 and 521 and the connection pad, and also adheres to the second conductive films 512 and 522. That is, the solder in a liquid phase state by a reflow process extends over the second conductive films 512 and 522 to form a solder fillet between the second conductive films 512 and 522 and the connection pad. In this way, in the semiconductor device 1A, the solder fillet is formed more easily. With this solder fillet, the bonding area of the solder can be increased to further increase the connection strength. Further, the solder fillet allows a soldering state of the semiconductor device 1A to be confirmed from the outside.

(4) In the conductive portion 20, the terminal portions 23 and 25 and the mounting portions 24 and 26 are integrally formed. The plating layer 920 including a portion constituting the terminal portions 23 and 25 and a portion constituting the mounting portions 24 and 26 is collectively grown. As a result, the number of steps is smaller than that in a case where the terminal portions 23 and 25 and the mounting portions 24 and 26 are separately plated and grown. As a result, it is possible to shorten the time required for manufacture, thereby improving the productivity.

(5) When the terminal portion 71 and the mounting portion 72 are separately plated and grown, a seed layer is formed for the mounting portion 72. In contrast, in the present embodiment, the plating layer 920 including the portion constituting the mounting portions 24 and 26 is collectively grown. Therefore, labor and time required for the step of forming the seed layer can be saved. Therefore, it is possible to shorten time required for manufacture, thereby improving the productivity.

(Modifications)

The above embodiment may be modified as follows, for example. The above embodiment and each of the following modifications may be combined with each other as long as there is no technical conflict. In the following modifications, the portions common to the above embodiment are denoted by the same reference numerals as those in the above embodiment, and explanation thereof will be omitted.

The above embodiment may have a configuration including three or more first conductive portions 21 and second conductive portions 22.

The above embodiment may have a configuration in which the number of first conductive portions 21 is different from the number of second conductive portions 22.

The above embodiment may have a configuration including a conductive portion exposed to at least one of the third resin side surface 103 and the fourth resin side surface 104.

The above embodiment may have a configuration in which the step 12 is not provided in the third resin side surface 103 and the fourth resin side surface 104 to which the conductive portion 20 is not exposed. That is, on the first resin side surface 101 and the fourth resin side surface 104, a position of the first side surface 111 and a position of the second side surface 112 may be the same when viewed in the Z direction.

(Supplementary Notes)

The technical feature that may be grasped from the present disclosure are described below. It should be noted that the constituent elements described in supplementary notes are provided with reference numerals of the corresponding constituent elements in the embodiment for the purpose of assisting understanding, not for the purpose of limiting. The reference numerals are shown as examples for the sake of comprehension, and the constituent elements described in each supplementary note should not be limited to the constituent elements indicated by the reference numerals.

(Supplementary Note 1)

A semiconductor device including:
a conductive portion (20, 21, 22); and
a semiconductor element (40) mounted on the conductive portion (20, 21, 22),
wherein the conductive portion (20, 21, 22) is made of a plating layer, wherein the conductive portion (20, 21, 22) includes a mounting portion (24, 26) having a mounting surface (241, 261) on which the semiconductor element (40) is mounted, and a terminal portion (23, 25) extending to an opposite side of the semiconductor element (40) with respect to the mounting portion (24, 26),
wherein the mounting portion (24, 26) extends in a first direction (X) along the mounting surface (241, 261) more than the terminal portion (23, 25), and
wherein the mounting portion (24, 26) and the terminal portion (23, 25) are integrally formed.

(Supplementary Note 2)

The semiconductor device of Supplementary Note 1, further including a bonding portion (30, 31, 32) provided on the mounting surface (241, 261),
wherein the conductive portion (20) is electrically connected to the semiconductor element (40) by the bonding portion (30, 31, 32).

(Supplementary Note 3)

The semiconductor device of Supplementary Note 1 or 2, wherein the conductive portion (20) includes a first conductive portion (21) and a second conductive portion (22) arranged apart from each other in the first direction.

(Supplementary Note 4)

The semiconductor device of Supplementary Note 3, further including a sealing resin (10) that seals the first conductive portion (21), the second conductive portion (22), and the semiconductor element (40).

(Supplementary Note 5)

The semiconductor device of Supplementary Note 4, wherein the sealing resin (10) includes a first resin portion (131) between a terminal portion (23, 25) of the first conductive portion (21) and a terminal portion (23, 25) of the second conductive portion (22), and a second resin portion (132) between a mounting portion (24, 26) of the first conductive portion (21) and a mounting portion (24, 26) of the second conductive portion (22), and wherein the first resin portion (131) and the second resin portion (132) are integrally formed.

(Supplementary Note 6)

The semiconductor device of Supplementary Note 4 or 5, wherein the sealing resin (10) has a resin upper surface (10s) facing the same direction as the mounting surface and a resin lower surface (10r) facing an opposite side of the resin upper surface (10s), and wherein the conductive portion (20) has a lower surface (232, 252) exposed from the resin lower surface (10r).

(Supplementary Note 7)

The semiconductor device of Supplementary Note 6, wherein the sealing resin (10) has a resin side surface (101, 102) intersecting with the resin lower surface (10r), and wherein the conductive portion (20) has a side surface (234, 244, 254, 264) exposed from the resin side surface (101, 102).

(Supplementary Note 8)

The semiconductor device of Supplementary Note 7, further including an external conductive film (50, 51, 52) that covers the lower surface (232, 252) and the side surface (234, 244, 254, 264) of the conductive portion (20) exposed from the sealing resin (10).

(Supplementary Note 9)

The semiconductor device of any one of Supplementary Notes 1 to 8, wherein the mounting portion (24, 26) and the terminal portion (23, 25) are made of the same material.

(Supplementary Note 10)

The semiconductor device of any one of Supplementary Notes 1 to 9, wherein the mounting portion (24, 26) and the terminal portion (23, 25) are made of a material containing Cu or a Cu alloy.

(Supplementary Note 11)

The semiconductor device of any one of Supplementary Notes 1 to 10, wherein a thickness of the terminal portion (23, 25) is equal to or more than twice a thickness of the mounting portion (24, 26).

(Supplementary Note 12)

The semiconductor device of any one of Supplementary Notes 1 to 11, wherein the thickness (T24, T26) of the mounting portion (24, 26) is 20 μm or more and 50 μm or less.

(Supplementary Note 13)

The semiconductor device of any one of Supplementary Notes 1 to 12, wherein the thickness (T23, T25) of the terminal portions (23, 25) is 100 μm or more and 300 μm or less.

(Supplementary Note 14)

The semiconductor device of any one of Supplementary Notes 1 to 13, wherein a length (L24, L26) of the mounting portion (24, 26) extending from the terminal portion (23, 25) in the first direction is equal to or less than a length (L23, L25) of the terminal portion (23, 25) in the first direction.

(Supplementary Note 15)

The semiconductor device of Supplementary Note 14, wherein the length (L24, L26) of the mounting portion (24, 26) in the first direction is 100 μm or more and 150 μm or less.

(Supplementary Note 16)

The semiconductor device of Supplementary Note 14 or 15, wherein the length (L23, L25) of the terminal portion (23, 25) in the first direction is 100 μm or more and 200 μm or less.

(Supplementary Note 17)

A method of manufacturing a semiconductor device, which includes a conductive portion (20, 21, 22), and a semiconductor element (40) mounted on the conductive portion (20, 21, 22), wherein the conductive portion (20, 21, 22) includes a mounting portion (24, 26) having a mounting surface (242, 261) on which the semiconductor element (40) is mounted, and a terminal portion (23, 25) extending on an opposite side of the semiconductor element (40) with respect to the mounting portion (24, 26), the method including integrally forming the mounting portion (24, 26) and the terminal portion (23, 25) by a plating layer (920).

(Supplementary Note 18)

The method of Supplementary Note 17, further including:
forming a first mask (902) having a first opening (9021) configured to form the terminal portion (23, 25); and
forming a second mask (903) having a second opening (9031) configured to form the mounting portion (24, 26) on the first mask,
wherein in the integrally forming the mounting portion (24, 26) and the terminal portion (23, 25), the plating layer (920) is formed by growing plating metal from the first opening (9021) of the first mask (902) to the second opening (9031) of the second mask (903).

(Supplementary Note 19)

The method of Supplementary Note 18, further including forming a resin layer (910) that seals the mounting portion (24, 26) and the semiconductor element (40).

(Supplementary Note 20)

The method of Supplementary Note 19, further including:
forming a third mask (904) having a third opening (9041) configured to form a bonding portion (30, 31, 32), on the second mask (903) and the plating layer (920); and
forming the bonding portion (30) on the plating layer (920).

(Supplementary Note 21)

The method of Supplementary Note 20, further including mounting the semiconductor element (40) on the mounting portion (24, 26) by the bonding portion (30).

(Supplementary Note 22)

The method of any one of Supplementary Notes 19 to 21, further including:
providing a support substrate (900); and
forming a seed layer (901) on an upper surface of the support substrate (900),
wherein the first mask (902) is formed on an upper surface of the seed layer (901).

(Supplementary Note 23)

The method of Supplementary Note 22, further including:
exposing a lower surface (232, 252) of the conductive portion (20) by removing the support substrate (900) and the seed layer (901); and
exposing the side surface (234, 244, 254, 264) of the conductive portion (20) by forming a separation groove (912) in the resin layer (910).

(Supplementary Note 24)

The method of Supplementary Note 23, further including forming an external conductive film (50, 51, 52) that covers the lower surface (232, 252) and the side surface (234, 244, 254, 264) of the conductive portion (20).

(Supplementary Note 25)

The method of Supplementary Note 24, further including separating the semiconductor device into individual pieces by cutting the resin layer (910) in the separation groove.

The above description is merely an example. Those skilled in the art will appreciate that more combinations and substitutions are possible other than the constituent elements and methods (manufacturing processes) listed for the purposes of illustrating the techniques of the present disclosure. The present disclosure is intended to include all alternatives, modifications, and changes included within the scope of the present disclosure, including the claims.

According to the present disclosure in some embodiments, it is possible to provide a semiconductor device and a method of manufacturing the semiconductor device, which are capable of suppressing occurrence of peeling.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
   a conductive portion; and
   a semiconductor element mounted on the conductive portion,
      wherein the conductive portion is made of a plating layer,
      wherein the conductive portion includes a mounting portion having a mounting surface on which the semiconductor element is mounted, and a terminal portion extending from the mounting portion toward a direction opposite to the semiconductor element,
      wherein the mounting portion extends in a first direction along the mounting surface more than the terminal portion, and
      wherein the mounting portion and the terminal portion are integrally formed without an interface formed therebetween.

2. The semiconductor device of claim 1, further comprising:
   a bonding portion provided on the mounting surface,
      wherein the conductive portion is electrically connected to the semiconductor element by the bonding portion.

3. The semiconductor device of claim 1, wherein the conductive portion includes a first conductive portion and a second conductive portion arranged apart from each other in the first direction.

4. The semiconductor device of claim 3, further comprising a sealing resin that seals the first conductive portion, the second conductive portion, and the semiconductor element.

5. The semiconductor device of claim 4,
   wherein the sealing resin includes a first resin portion between a terminal portion of the first conductive portion and a terminal portion of the second conductive portion, and a second resin portion between a mounting portion of the first conductive portion and a mounting portion of the second conductive portion, and
   wherein the first resin portion and the second resin portion are integrally formed.

6. The semiconductor device of claim 4,
wherein the sealing resin has a resin upper surface facing the same direction as the mounting surface and a resin lower surface facing an opposite side of the resin upper surface, and
wherein the conductive portion has a lower surface exposed from the resin lower surface.

7. The semiconductor device of claim 6,
wherein the sealing resin has a resin side surface intersecting with the resin lower surface, and
wherein the conductive portion has a side surface exposed from the resin side surface.

8. The semiconductor device of claim 7, further comprising an external conductive film that covers the lower surface and the side surface of the conductive portion exposed from the sealing resin.

9. A method of manufacturing a semiconductor device, which includes a conductive portion and a semiconductor element mounted on the conductive portion, wherein the conductive portion includes a mounting portion having a mounting surface on which the semiconductor element is mounted, and a terminal portion extending from the mounting portion toward a direction opposite to the semiconductor element, the method comprising:
 integrally forming the mounting portion and the terminal portion by a plating layer.

10. The method of claim 9, further comprising:
 forming a first mask having a first opening configured to form the terminal portion; and
 forming a second mask having a second opening configured to form the mounting portion on the first mask,
 wherein in the integrally forming the mounting portion and the terminal portion, the plating layer is formed by growing plating metal from the first opening of the first mask to the second opening of the second mask.

11. The method of claim 10, further comprising forming a resin layer that seals the mounting portion and the semiconductor element.

* * * * *